United States Patent
Akiyama et al.

(10) Patent No.: US 7,758,979 B2
(45) Date of Patent: Jul. 20, 2010

(54) PIEZOELECTRIC THIN FILM, PIEZOELECTRIC MATERIAL, AND FABRICATION METHOD OF PIEZOELECTRIC THIN FILM AND PIEZOELECTRIC MATERIAL, AND PIEZOELECTRIC RESONATOR, ACTUATOR ELEMENT, AND PHYSICAL SENSOR USING PIEZOELECTRIC THIN FILM

(75) Inventors: Morito Akiyama, Saga (JP); Toshihiro Kamohara, Saga (JP); Naohiro Ueno, Saga (JP); Kazuhiko Kano, Aichi (JP); Akihiko Teshigahara, Aichi (JP); Yukihiro Takeuchi, Aichi (JP); Nobuaki Kawahara, Aichi (JP)

(73) Assignees: National Institute of Advanced Industrial Science and Technology, Tokyo (JP); DENSO CORPORATION, Kariya (JP)

( * ) Notice: Subject to any disclaimer, the term of this patent is extended or adjusted under 35 U.S.C. 154(b) by 1 day.

(21) Appl. No.: 12/155,015

(22) Filed: May 29, 2008

(65) Prior Publication Data
US 2008/0296529 A1    Dec. 4, 2008

(30) Foreign Application Priority Data
May 31, 2007  (JP) .............................. 2007-144851
Apr. 4, 2008   (JP) .............................. 2008-098480

(51) Int. Cl.
*B32B 9/00* (2006.01)
(52) U.S. Cl. ................. 428/699; 428/698; 428/704
(58) Field of Classification Search .......... 252/62.9 PZ, 252/62.9 R; 428/698, 699, 704
See application file for complete search history.

(56) References Cited

U.S. PATENT DOCUMENTS

2004/0135144 A1   7/2004   Yamada et al.

FOREIGN PATENT DOCUMENTS

DE   197 460 010 A1   4/1999
JP   A-08-285519      11/1996

OTHER PUBLICATIONS

V. Ranjan et al., "Strained Hexagonal ScN: A Material with Unusual Structural and Optical Properties," Physical Review Letters, vol. 90, No. 25 (2003), pp. 257602-1-257602-4.
V. Ranjan et al., "Properties of GaN/ScN and InN/ScN superlattices from first principles," Physical Review B 72, 085315 (2005), pp. 085315-1-085315-9.
Office Action mailed Sep. 18, 2009 for corresponding Chinese patent application No. 2008100998578 (English translation enclosed).
Korean Notification of Reason for Refusal issued from the Korean Intellectual Property Office on Mar. 5, 2010 in the corresponding Korean patent application No. 10-2008-0050510 (a copy and English translation thereof).

*Primary Examiner*—Gwendolyn Blackwell
(74) *Attorney, Agent, or Firm*—Posz Law Group, PLC

(57) ABSTRACT

A piezoelectric thin film of the present invention includes an aluminum nitride thin film that contains scandium. A content ratio of scandium in the aluminum nitride thin film is 0.5 atom % to 50 atom % on the assumption that a total amount of the number of scandium atoms and the number of aluminum atoms is 100 atom %. According to this arrangement, the piezoelectric thin film of the present invention can improve a piezoelectric response while keeping characteristics of elastic wave propagation speed, Q value, and frequency-temperature coefficient that the aluminum nitride thin film has.

8 Claims, 12 Drawing Sheets

PIEZOELECTRIC THIN FILM, PIEZOELECTRIC MATERIAL, AND FABRICATION METHOD OF PIEZOELECTRIC THIN FILM AND PIEZOELECTRIC MATERIAL, AND PIEZOELECTRIC RESONATOR, ACTUATOR ELEMENT, AND PHYSICAL SENSOR USING PIEZOELECTRIC THIN FILM

This Nonprovisional application claims priority under 35 U.S.C. §119(a) on Patent Applications No. 144851/2007 filed in Japan on May 31, 2007 and No. 098480/2008 filed in Japan on Apr. 4, 2008, the entire contents of which are hereby incorporated by reference.

FIELD OF THE INVENTION

The present invention relates to a piezoelectric material and a piezoelectric thin film, in particular, to a piezoelectric material in which scandium is added to aluminum nitride, and a piezoelectric film in which scandium is added to aluminum nitride.

BACKGROUND OF THE INVENTION

A device that utilizes a piezoelectric phenomenon is applied in a wide range of fields. The application of such a device is increasing particularly in portable apparatuses such as mobile phones for which size reduction and power consumption saving are strongly demanded. IF (Intermediate Frequency) and RF (Radio Frequency) filters are examples of the application of the device. Specific examples of the IF and RF filters include an SAW (Surface Acoustic Wave) filter that uses an elastic SAWR (Surface Acoustic Wave Resonator).

The SAW filter is a filter that uses a resonator utilizing acoustic waves that travels a surface of solid. As a result of improvement in design and production engineering, the SAW filter satisfies difficult requests from a user. However, as a frequency that the SAW filter utilizes becomes higher, the SAW filter approaches to a limit of improvement in characteristics.

Therefore, an FBAR (Film Bulk Acoustic Resonator) filter has been developed as a new filter that is to replace the SAW filter. The FBAR filter uses a thin FBAR that is one of RF-MEMS (Radio Frequency-Micro Electro Mechanical System) devices.

The RF-MEMS is a technique that has been spotlighted recently. In this technique, a mechanical fine structure is fabricated mainly on a semiconductor substrate and an MEMS is applied to an RF front end. The MEMS is a technique for fabricating a device such as fine actuator, sensor, oscillator or the like.

The FBAR filter that is one of RF-MEMS devices is a filter that uses a resonator employing a thickness vertical vibration mode of a thin film that exhibits a piezoelectric response. In other words, the FBAR filter is a filter that uses a resonator utilizing a phenomenon in which a piezoelectric thin film vibrates in a thickness vertical direction in response to an inputted high frequency electrical signal and this vibration produces resonance in a thickness direction of the thin film. In this filter, resonance in a gigahertz frequency range is possible. The FBAR filter that has a characteristic as mentioned above has low loss. Moreover, the FBAR filter can operate in a broad band and realizes further size reduction and power consumption saving of portable apparatuses.

Moreover, RF-MEMS devices other than the FBAR filter, for example, an RF-MEMS capacitor and an RF-MEMS switch also realize low loss, high isolation, and low distortion in a high frequency range, by utilizing a piezoelectric phenomenon.

Examples of a piezoelectric material that constitutes a piezoelectric thin film used for the aforesaid RF-MEMS devices or the like are aluminum nitride (AlN), zinc oxide (ZnO), lithium niobate (LiNbO$_3$), and lead zirconate titanate (Pb (Zr, Ti) O$_3$; PZT). In particular, a piezoelectric thin film including aluminum nitride has preferable characteristics of elastic wave propagation speed, Q value, and frequency-temperature coefficient. Accordingly, aluminum nitride is known as a very preferable piezoelectric material for a piezoelectric thin film resonator of a filter that operates in a high frequency range (See, for example, Japanese Unexamined Patent Publication No. 344279/2002 (Tokukai 2002-344279) (published on Nov. 29, 2002)).

Japanese Unexamined Patent Publication No. 344279/2002 discloses that addition of a third component such as alkaline earth metal and/or rare earth metal to an aluminum nitride thin film improves a resonance characteristic.

However, the aluminum nitride thin film has a piezoelectric constant that is lower than those of other piezoelectric materials. Specifically, a piezoelectric constant $d_{33}$ of the aluminum nitride thin film is approximately 5.1 pC/N to 6.7 pC/N. On the other hand, a piezoelectric constant $d_{33}$ of a zinc oxide thin film is approximately 9.9 pC/N to 12.4 pC/N and a piezoelectric constant $d_{33}$ of a lithium niobate thin film is approximately 6 pC/N to 12 pC/N. Further, a piezoelectric constant $d_{33}$ of a lead zirconate titanate thin film is approximately 97 pC/N to 100 pC/N. In other words, the piezoelectric constant of the aluminum nitride thin film is approximately ½ to 1/20 of the piezoelectric constant of each of thin films that are made of other piezoelectric materials.

Accordingly, for example, a case where a device such as an RF-MEMS device employs a piezoelectric thin film including an aluminum nitride thin film requires an operation voltage that is higher than that in a case employing other piezoelectric material such as zinc oxide. That is, in the device that includes the piezoelectric thin film containing aluminum nitride, for example, an RF-MEMS device, power consumption saving becomes difficult.

Further, due to the low piezoelectric constant, an actuator employing the piezoelectric thin film containing aluminum nitride has an operational range that is narrower than that of an actuator employing a piezoelectric thin film that includes a piezoelectric material such as zinc oxide having a high piezoelectric constant. Further, in case where the piezoelectric thin film containing aluminum nitride is employed in a filter, loss becomes larger. In other words, the low piezoelectric constant of aluminum nitride is one factor that prevents size reduction and improvement of performance of a device employing the piezoelectric thin film containing aluminum nitride.

The present invention is attained in view of the aforesaid problems. The main object of the present invention is to provide a piezoelectric thin film including an aluminum nitride thin film.

SUMMARY OF THE INVENTION

As a method of improving a piezoelectric response of a piezoelectric material, a result of calculation based on computational science in V. Ranjan et al., PHYSICAL REVIEW LETTERS, 90, 25, 257602 (2003), suggests that improvement of the piezoelectric response is possible by distorting a crystal lattice of scandium nitride (ScN). Scandium nitride (ScN) has a hexagonal crystal lattice that is a metastable state. Further, a result of calculation based on computational science in V. Ranjan et al., PHYSICAL REVIEW B, 72, 085315 (2005) suggests that improvement of the piezoelectric response is possible by adding scandium (Sc) to gallium nitride (GaN) and indium nitride (InN).

The inventors of the present invention made a supposition that addition of an appropriate amount of scandium to aluminum nitride can vary a crystal structure of aluminum nitride and improve a piezoelectric response of aluminum nitride. The inventors devoted to research of an amount of scandium to be added and has attained the present invention.

Note that each of V. Ranjan et al., PHYSICAL REVIEW LETTERS, 90, 25, 257602 (2003) and V. Ranjan et al., PHYSICAL REVIEW B, 72, 085315 (2005) is a result of simulation in a virtual space. In V. Ranjan et al., PHYSICAL REVIEW LETTERS, 90, 25, 257602 (2003), the crystalline lattice of scandium nitride is not actually distorted. Moreover, in V. Ranjan et al., PHYSICAL REVIEW B, 72, 085315 (2005), scandium is not actually added to gallium nitride and indium nitride.

Further, gallium nitride and indium nitride are materials that are highly spotlighted in light emitting devices such as a light emitting diode. Many researches are carried out in order to realize size reduction and power consumption saving of light emitting devices. On the other hand, because aluminum nitride that has a wide band gap does not emit visible light, aluminum nitride is used as a buffer layer of a light emitting device that contains gallium nitride. Therefore, a research for improving a piezoelectric response of aluminum nitride is hardly carried out. That is, V. Ranjan et al., PHYSICAL REVIEW LETTERS, 90, 25, 257602 (2003) and V. Ranjan et al., PHYSICAL REVIEW B, 72, 085315 (2005) and V. Ranjan et al., PHYSICAL REVIEW LETTERS, 90, 25, 257602 (2003) disclose nothing about improving a piezoelectric response by adding scandium to aluminum nitride.

The present invention is attained based on the aforementioned novel view and encompasses the following invention.

In order to solve the problems mentioned above, a piezoelectric thin film of the present invention includes an aluminum nitride thin film that contains a rare earth element, the rare earth element being scandium, and a content ratio of the scandium being in a range of 0.5 atom % to 50 atom % on an assumption that a total amount of a number of atoms of the scandium and a number of atoms of aluminum in the aluminum nitride thin film is 100 atom %.

By setting the content ratio of scandium in the aluminum nitride thin film in the aforesaid range, the piezoelectric response can be improved while characteristics of elastic wave propagation speed, Q value, and frequency-temperature coefficient that the aluminum nitride thin film has are kept.

This allows the piezoelectric thin film of the present invention to produce an effect that is not obtainable by using a piezoelectric thin film that includes a conventional aluminum nitride. Specifically, in case where the piezoelectric thin film that includes aluminum nitride as arranged above is applied to a device such as an RF-MEMS device, a low voltage operation of the device can be realized. Moreover, when the aforesaid device is an actuator, an operational range at the same voltage can be increased and an operation voltage in the same operational range can be lowered. Further, when the aforesaid device is a filter, an insertion loss can be reduced. Accordingly, the piezoelectric thin film of the present invention can realize size reduction and power consumption saving of the device that includes the piezoelectric thin film, and the performance of the device can also be improved. Furthermore, when the piezoelectric thin film of the present invention is applied to a physical sensor such as a gyro sensor, a pressure sensor, and an acceleration sensor, detection sensitivity of the physical sensor can be improved.

Moreover, it is preferable that the piezoelectric thin film of the present invention consists of the aluminum nitride thin film that contains a rare earth element, the rare earth element being scandium, and a content ratio of the scandium being in a range of 0.5 atom % to 35 atom % or 40 atom % to 50 atom % on an assumption that a total amount of a number of atoms of the scandium and a number of atoms of aluminum in the aluminum nitride thin film is 100 atom %.

According to the arrangement, the piezoelectric thin film is made of an aluminum nitride thin film that contains scandium in a range of 0.5 atom % to 35 atom % or 40 atom % to 50 atom %. In particular, in case where the aluminum nitride thin film that contains scandium is formed directly on the substrate, the content ratio of scandium that is included in the aluminum nitride thin film is set in the aforesaid range. This allows the piezoelectric thin film to improve a piezoelectric response while characteristics of elastic wave propagation speed, Q value, and frequency-temperature coefficient that the aluminum nitride thin film has are kept.

It is preferable that, in the piezoelectric thin film of the present invention, the aluminum nitride thin film is provided on a substrate; and the aluminum nitride thin film and the substrate sandwiches at least one layer of an intermediate layer.

By providing the intermediate layer between the substrate and the aluminum nitride thin film, it becomes possible to suppress deterioration of the piezoelectric response which deterioration occurs in a case where the intermediate layer is not provided. In other words, the arrangement makes it possible to prevent deterioration of the piezoelectric response which deterioration occurs in a case where a concentration of scandium is larger than 35 atom % and smaller than 40 atom %.

This makes precise control of composition unnecessary. Accordingly, it becomes possible to easily obtain the aluminum nitride thin film whose piezoelectric response is improved.

It is preferable that, in the piezoelectric thin film of the present invention, the content ratio of the scandium is in a range of 15 atom % to 45 atom % on the assumption that the total amount of the number of atoms of the scandium and the number of atoms of the aluminum in the aluminum nitride thin film is 100 atom %.

According to the arrangement, even when the intermediate layer is provided between the substrate and the aluminum nitride thin film, the piezoelectric response can be improved while characteristics of elastic wave propagation speed, Q value, and frequency-temperature coefficient that the aluminum nitride thin film has are kept.

It is preferable that, in the piezoelectric thin film of the present invention, the content ratio of the scandium is in a range of 10 atom % to 35 atom % on the assumption that the total amount of the number of atoms of the scandium and the number of atoms of the aluminum is 100 atom %.

By setting the content ratio of scandium that is contained in the aluminum nitride thin film in the above range, a surface roughness can be reduced. That is, evenness of a film thickness of the piezoelectric thin film can be improved.

In general, a resonance frequency of a filter or the like depends on a film thickness. Therefore, by applying the piezoelectric thin film of the present invention to, for example, an SAW device so as to improve precision of the film thickness, propagation loss can be suppressed. This can realize an SAW filter whose insertion loss and noise are reduced. Moreover, by reducing the surface roughness of the piezoelectric thin film so as to eliminate a grain boundary of polycrystal, the piezoelectric thin film can have an increased density. This makes it possible to prevent short-circuiting at the time when the aluminum nitride thin film is sandwiched by electrodes, in case where the piezoelectric thin film of the present invention is applied to, for example, an FBAR filter.

It is preferable that, in the piezoelectric thin film of the present invention, the content ratio of the scandium is in a range of 40 atom % to 50 atom % on the assumption that the total amount of the number of atoms of the scandium and the number of atoms of the aluminum is 100 atom %.

By setting the content ratio of scandium that is contained in the aluminum nitride thin film in the aforementioned range, the piezoelectric response can be further improved while characteristics of the aluminum nitride thin film are kept.

This allows the piezoelectric thin film of the present invention to produce an improved effect that cannot be obtained by a piezoelectric thin film including a conventional aluminum nitride. Specifically, in case where the piezoelectric thin film that includes aluminum nitride in the above arrangement is applied to a device such as an RF-MEMS device, operation of the device at a further reduced voltage can be realized. Moreover, when the aforesaid device is an actuator, an operational range at the same voltage can be further increased and an operation voltage in the same operational range can be further lowered. Furthermore, when the aforesaid device is a filter, an insertion loss can be further reduced. Accordingly, the piezoelectric thin film of the present invention can realize size reduction and power consumption saving in the further device that includes the piezoelectric thin film, and the performance of the device can be further improved. When the piezoelectric thin film of the present invention is applied to a physical sensor such as a gyro sensor, a pressure sensor, and an acceleration sensor, detection sensitivity of the physical sensor can be further improved.

It is preferable that, in the piezoelectric thin film of the present invention, the intermediate layer is a titanium nitride thin film or an aluminum nitride thin film containing scandium at a content ratio different from that of the aluminum nitride thin film.

In order to solve the problems mentioned above, a piezoelectric material of the present invention includes aluminum nitride that contains a rare earth element, the rare earth element being scandium, and a content ratio of the scandium being in a range of 0.5 atom % to 50 atom % on an assumption that a total amount of a number of atoms of the scandium and a number of atoms of aluminum in the aluminum nitride is 100 atom %.

The above arrangement produces the substantially same effect as a piezoelectric thin film that includes an aluminum nitride thin film whose content ratio of scandium is in a range of 0.5 atom % to 50 atom %.

It is preferable that the piezoelectric material of the present invention consists of aluminum nitride that contains a rare earth element, the rare earth element being scandium, and a content ratio of the scandium being in a range of 0.5 atom % to 35 atom % or 40 atom % to 50 atom % on the assumption that the total amount of the number of atoms of the scandium and the number of atoms of the aluminum in the aluminum nitride is 100 atom %.

The above arrangement produces the substantially same effect as a piezoelectric thin film that is made of an aluminum nitride thin film whose content ratio of scandium is in a range of 0.5 atom % to 35 atom % or 40 atom % to 50 atom %.

In order to solve the problems mentioned above, a fabrication method of a piezoelectric thin film of the present invention including, on a substrate, an aluminum nitride thin film that contains a rare earth element, the fabrication method includes the step of: sputtering aluminum and scandium simultaneously in an atmosphere including at least nitrogen gas, in which step of sputtering a power density of the scandium is in a range of 0.05 W/cm$^2$ to 10 W/cm$^2$.

The sputtering of scandium at a power density of the aforesaid range in the atmosphere that includes at least nitrogen gas allows an aluminum nitride thin film to have a content ratio of scandium in a range of 0.5 atom % to 45 atom %. Accordingly, an aluminum nitride film fabricated by the sputtering produces substantially the same effect as a piezoelectric thin film that includes an aluminum nitride thin film whose content ratio of scandium is in a range of 0.5 atom % to 45 atom %.

It is preferable that the fabrication method of the piezoelectric thin film of the present invention, the piezoelectric thin film consisting of the aluminum nitride thin film, includes the step of: sputtering aluminum and scandium simultaneously onto the substrate, in which step of sputtering a power density of the scandium is in a range of 0.05 W/cm$^2$ to 6.5 W/cm$^2$ or 8.5 W/cm$^2$ to 10 W/cm$^2$.

The sputtering of scandium at the power density of the aforesaid range allows an aluminum nitride thin film to have a content ratio of scandium in a range of 0.5 atom % to 35 atom % or 40 atom % to 45 atom %. Accordingly, an aluminum nitride film fabricated by the sputtering produces substantially the same effect as a piezoelectric thin film that includes an aluminum nitride thin film whose content ratio of scandium is in a range of 0.5 atom % to 35 atom % or 40 atom % to 45 atom %.

It is preferable that the fabrication method of the piezoelectric film of the present invention further includes the step of: forming an intermediate layer on a substrate prior to the step of sputtering in which step of sputtering the power density of the scandium in the range of 0.05 W/cm$^2$ to 10 W/cm$^2$.

The sputtering of scandium at a power density of the aforesaid range allows an aluminum nitride thin film that is formed on the intermediate layer to have a content ratio of scandium in a range of 15 atom % to 45 atom %. Accordingly, an aluminum nitride film fabricated by the sputtering produces substantially the same effect as a piezoelectric thin film that includes an aluminum nitride thin film whose content ratio of scandium is in a range of 15 atom % to 45 atom % which aluminum nitride thin film is formed on the intermediate layer.

It is preferable that, in the fabrication method of the piezoelectric thin film of the present invention, the power density in the step of sputtering is in a range of 2 W/cm$^2$ to 6.5 W/cm$^2$.

The sputtering of scandium at the power density of the aforesaid range allows an aluminum nitride thin film to have a content ratio of scandium in a range of 10 atom % to 35 atom %. Accordingly, an aluminum nitride film fabricated by the sputtering produces substantially the same effect as a piezoelectric thin film that includes an aluminum nitride thin film whose content ratio of scandium is in a range of 10 atom % to 35 atom %.

It is preferable that, in the fabrication method of the piezoelectric thin film of the present invention, the power density in the step of sputtering is in a range of 9.5 W/cm$^2$ to 10 W/cm$^2$.

The sputtering of scandium at the power density of the aforesaid range allows an aluminum nitride thin film to have a content ratio of scandium in a range of 40 atom % to 45 atom %. Accordingly, an aluminum nitride film fabricated by the sputtering produces substantially the same effect as a piezoelectric thin film that includes an aluminum nitride thin film whose content ratio of scandium is in a range of 40 atom % to 45 atom %.

It is preferable that, in the fabrication method of the piezoelectric thin film of the present invention, the temperature of the substrate in the step of sputtering is in a range of 20° C. to 600° C.

By setting the temperature of the substrate in the aforesaid range to which substrate aluminum and scandium are adhered, a piezoelectric response of the aluminum nitride thin film that contains scandium can be further improved.

In addition, the scope of the present invention encompasses a piezoelectric thin film resonator including the piezoelectric thin film, a filter including the piezoelectric thin film resonator, an actuator element including the piezoelectric thin film, and a physical sensor such as a gyro sensor, a pressure sensor, and an acceleration sensor, which physical sensor includes the piezoelectric thin film.

Additional objects, features, and strengths of the present invention will be made clear by the description below. Further, the advantages of the present invention will be evident from the following explanation in reference to the drawings.

BRIEF DESCRIPTION OF THE DRAWINGS

FIG. 5(a) illustrates a case where an intermediate layer is not provided. FIG. 5(b) illustrates a case where an $Sc_{0.40}Al_{0.60}N$ layer is provided as an intermediate layer. FIG. 5(c) illustrates a case where an $Sc_{0.42}Al_{0.58}N$ layer is provided as an intermediate layer. FIG. 5(d) illustrates a case where an $Sc_{0.50}Al_{0.50}N$ layer is provided as an Sc-containing aluminum nitride thin film and $Sc_{0.42}Al_{0.58}N$ layer is provided as an intermediate layer. FIG. 5(e) illustrates a case where an intermediate layer is made of a plurality of layers.

FIG. 10(a) illustrates a state in which a voltage is not applied. FIG. 10(b) illustrates a state in which a voltage is applied.

FIG. 11(a) illustrates a case where a piezoelectric thin film intervenes between an upper electrode and a lower electrode. FIG. 11(b) illustrates a case where a supporting section is further provided between the piezoelectric thin film and the lower electrode.

FIG. 12(a) illustrates a case where magnesium is added to an aluminum nitride thin film. FIG. 12(b) illustrates a case where boron is added to an aluminum nitride thin film. FIG. 12(c) illustrates a case where silicon is added to an aluminum nitride thin film. FIG. 12(d) illustrates a case where titanium is added to an aluminum nitride thin film. FIG. 12(e) illustrates a case where chrome is added to an aluminum nitride thin film.

FIG. 13(a) illustrates a case where an Sc-content is 25 atom %. FIG. 13(b) illustrates a case where an Sc-content is 0 atom %. FIG. 13(c) illustrates a case where an Sc-content is 38 atom %. FIG. 13(d) illustrates a case where an Sc-content is 42 atom %.

DESCRIPTION OF THE EMBODIMENTS

Embodiment 1

One embodiment of a piezoelectric thin film of the present invention is explained below as Embodiment 1, with reference to FIGS. 1 and 2.

Note that a specific application of the piezoelectric thin film of the present invention is not specifically limited in case where the piezoelectric thin film is used in a piezoelectric element that utilizes a piezoelectric phenomenon. For example, the piezoelectric thin film can be applied to an SAW device or an RF-MEMS device. A "piezoelectric material" in the present specification and the like indicates a substance that has a characteristic to produce a potential difference in response to application of mechanical force, that is, a piezoelectric characteristic (hereinafter, also referred to as piezoelectric response). Moreover, a "piezoelectric thin film" indicates a thin film that has the characteristic.

Further, "atom %" in the present specification and the like indicates atom percentage. More specifically, the "atom %" indicates the number of scandium atoms or the number of aluminum atoms on the assumption that a total amount of the number of scandium atoms and the number of aluminum atoms equals 100 atom %. In other words, the "atom %" indicates a concentration of scandium atoms or aluminum atoms in aluminum nitride that contains scandium. The present embodiment is explained on the assumption that atom % of scandium is a content ratio of scandium with respect to aluminum nitride.

The aluminum nitride thin film that contains scandium (hereinafter, also referred to as an Sc-containing aluminum nitride thin film) of the present embodiment can be expressed as $Sc_xAl_{1-x}N$ (where x is a content ratio (concentration) of scandium and in a range of 0.005 to 0.5) in a general formula. For example, in case where the aluminum nitride thin film has a content ratio of scandium of 10 atom %, the aluminum nitride thin film is expressed as $Sc_{0.1}Al_{0.9}N$.

(Scandium Content Ratio that Improves Piezoelectric Response)

Figure 1:
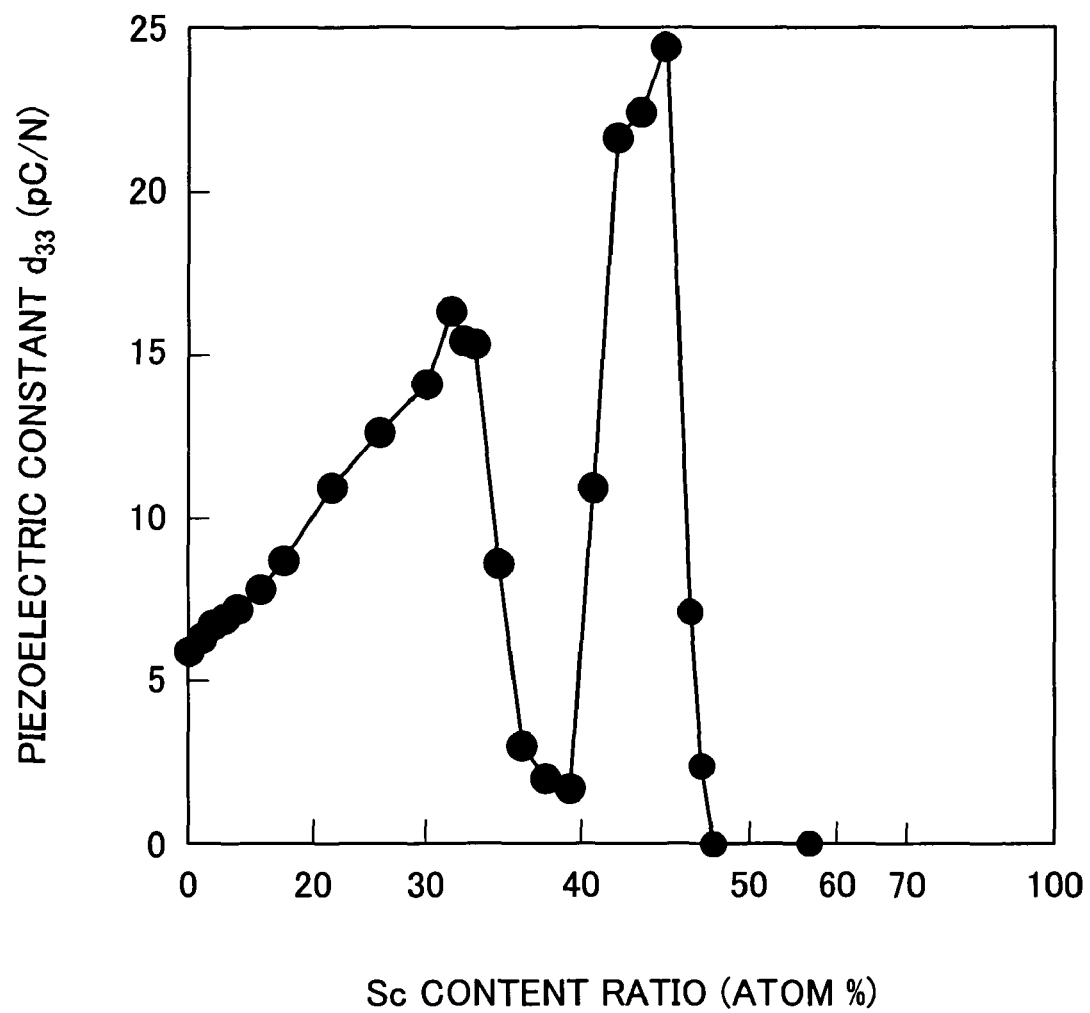
FIG. 1 is a diagram illustrating a relationship between a content ratio of scandium and a piezoelectric response of an Sc-containing aluminum nitride thin film.

As illustrated in FIG. 1, a piezoelectric response (piezoelectric characteristic) of an Sc-containing aluminum nitride thin film can be improved by varying a content ratio of scandium that is contained in the Sc-containing aluminum nitride thin film. FIG. 1 is a diagram illustrating a relationship between a content ratio of scandium and a piezoelectric response of an Sc-containing aluminum nitride thin film. As illustrated in FIG. 1, compared with a case where the content ratio of scandium is 0%, the piezoelectric response improves in a case where any amount of scandium is contained. Specifically, the piezoelectric response of the Sc-containing aluminum nitride thin film can be improved by setting the content ratio of scandium in a range of 0.5 atom % to 35 atom % or 40 atom % to 50 atom %. The piezoelectric response of the Sc-containing aluminum nitride thin film of approximately 6 pC/N to 24.6 pC/N is obtained by an arrangement that has the content ratio of scandium in the aforesaid range. A piezoelectric response of a general aluminum nitride thin film is in a range of approximately 5.1 pC/N to 6.7 pC/N. Therefore, the piezoelectric response can be improved approximately 1.4 to 4 times in the arrangement that has the content ratio of scandium in the aforementioned range.

As a result, an operation of an RF-MEMS device at a low voltage can be realized when the RF-MEMS device includes a piezoelectric thin film 1 that is provided with the Sc-containing aluminum nitride thin film having the content ratio of scandium in the aforesaid range. Moreover, when an RF-MEMS actuator includes the piezoelectric thin film 1, an operational range of the RF-MEMS actuator can be widened. Further, when an FBAR filter includes the piezoelectric thin film 1, an insertion loss of the FBAR filter can be reduced. In addition, when the piezoelectric thin film 1 is applied to a physical sensor such as a gyro sensor, a pressure sensor, and an acceleration sensor, detection sensitivity of the sensor can be improved.

Therefore, when the content ratio of scandium is in the aforesaid range, it is possible to realize size reduction and power consumption saving of a device that includes a piezoelectric thin film provided with the Sc-containing aluminum nitride thin film. Moreover, performance of the device can be improved.

(Scandium Content Ratio that Further Improves Piezoelectric Response)

In view of further improvement of the piezoelectric response, a preferable content ratio of scandium is in a range of 40 atom % to 50 atom %. As illustrated in FIG. 1, the piezoelectric response of the Sc-containing aluminum nitride thin film has a maximum value (approximately 24.6 pC/N) when the content ratio of scandium is 45 atom % ($Sc_{0.45}Al_{0.55}N$). This piezoelectric response is approximately four times as much as a piezoelectric response of aluminum nitride that does not contain scandium. Note that the content ratio of scandium at the maximum piezoelectric response has a measurement error of approximately ±5 atom %, depending on a condition such as a measurement condition.

Therefore, when the content ratio of scandium is in the aforesaid range, it is possible to realize further size reduction and further power consumption saving of a device that includes the piezoelectric thin film provided with the Sc-containing aluminum nitride thin film. Moreover, performance of the device can be further improved.

The effect explained above is not limited to the piezoelectric thin film. The substantially same effect that is obtained by the piezoelectric thin film of the present embodiment can be attained by a piezoelectric material that includes aluminum nitride containing scandium in a range of 0.5 atom % to 35 atom % or 40 atom % to 50 atom % on the assumption that the total amount of the number of scandium atoms and the number of aluminum atoms is 100 atom %.

(Structure of Piezoelectric Thin Film 1)

Here, one example of a piezoelectric thin film of the present invention is specifically explained with reference to FIG. 2.

Figure 2:
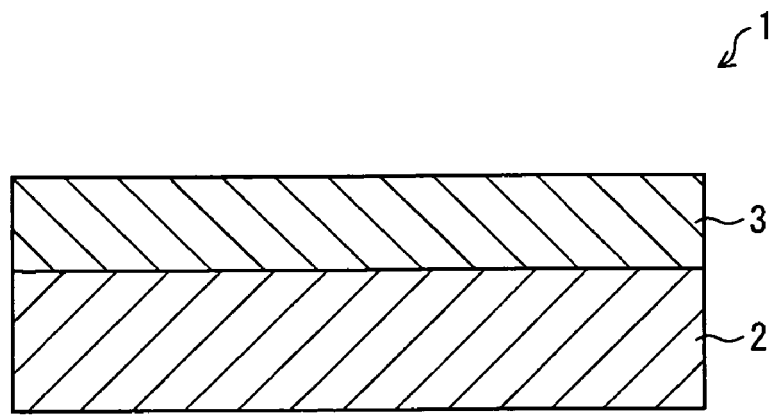
FIG. 2 is a cross sectional view schematically illustrating a piezoelectric thin film of Embodiment 1.

As illustrated in FIG. 2, the piezoelectric thin film 1 includes an aluminum nitride thin film containing scandium (hereinafter, also referred to as an Sc-containing aluminum nitride thin film) 3 on a substrate 2. The Sc-containing aluminum nitride thin film 3 includes scandium in a range of 0.5 atom % to 50 atom % on the assumption that the total amount of the number of scandium atoms and the number of aluminum atoms is 100 atom %. FIG. 2 is a cross sectional view schematically illustrating the piezoelectric thin film 1.

(Substrate 2)

The substrate 2 holds the Sc-containing aluminum nitride thin film 3 so that the Sc-containing aluminum nitride thin film 3 is not deformed. A material of the substrate 2 is not specifically limited. Examples of the material of the substrate 2 are single-crystal silicon (Si) and a material obtained by forming a polycrystalline film that is made of silicon, diamond or the like on a surface of a base that is made of single-crystal Si or the like.

(Sc-Containing Aluminum Nitride Thin Film 3)

The Sc-containing aluminum nitride thin film 3 is an aluminum nitride thin film containing scandium and has a piezoelectric response.

Embodiment 2

Another embodiment of a piezoelectric thin film of the present invention is explained below as Embodiment 2, with reference to FIGS. 3 through 5. In the present Embodiment, members given the same reference numerals as in Embodiment 1 respectively have identical functions. Further, the same terms as in Embodiment 1 have identical meanings.

(Structure of Piezoelectric Thin Film 1*b*)

Figure 3:
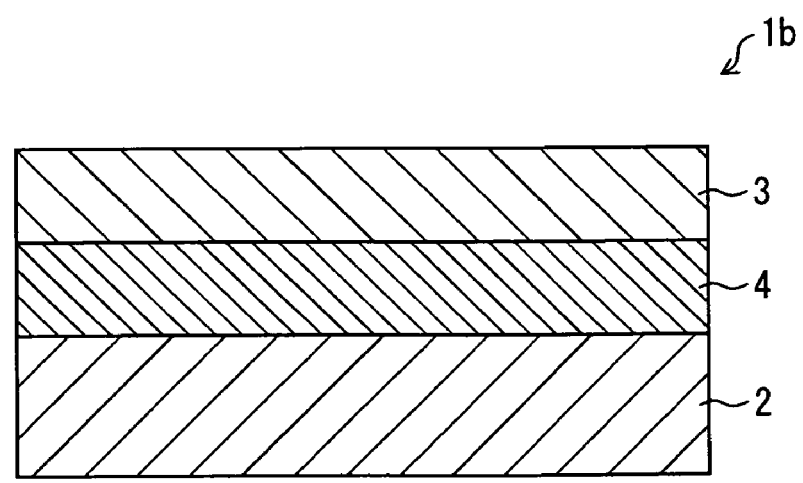
FIG. 3 is a cross sectional view schematically illustrating a piezoelectric thin film of Embodiment 2.

As illustrated in FIG. 3, a piezoelectric thin film 1*b* has an intermediate layer 4 that is formed so as to intervene between a substrate 2 and an Sc-containing aluminum nitride thin film 3. That is, in the piezoelectric thin film 1*b*, the Sc-containing aluminum nitride thin film 3 is provided on the substrate via the intermediate layer 4. The substrate 2 and the Sc-containing aluminum nitride thin film 3 are explained in Embodiment 1 and detailed explanations thereof are emitted here. Accordingly, in the present embodiment, only the intermediate layer 4 is explained below. FIG. 3 is a cross sectional view schematically illustrating the piezoelectric thin film 1*b*.

(Intermediate Layer 4)

The intermediate layer 4 is provided so as to produce interaction with the Sc-containing aluminum nitride thin film 3. A preferable material of the interlayer 4 is a material that easily produces interaction with both of the Sc-containing aluminum nitride thin film 3 and the substrate 2. Examples of the materials constituting the intermediate layer 4 are titanium nitride (TiN), scandium nitride (ScN), molybdenum (Mo), titanium (Ti), ruthenium (Ru), ruthenium oxide ($RuO_2$), chrome (Cr), chromium nitride (CrN), platinum (Pt), gold (Au), silver (Ag), copper (Cu), aluminum (Al), tantalum (Ta), iridium (Ir), palladium (Pd), and nickel (Ni).

For example, in case where $Sc_{0.45}Al_{0.55}N$ is used as the Sc-containing aluminum nitride thin film 3, a piezoelectric response can be improved by approximately 4 pC/N by using scandium nitride (ScN) as the intermediate layer 4 as compared with a case where the interlayer is not provided.

(Scandium Content Ratio that Improves Piezoelectric Response)

Figure 4:
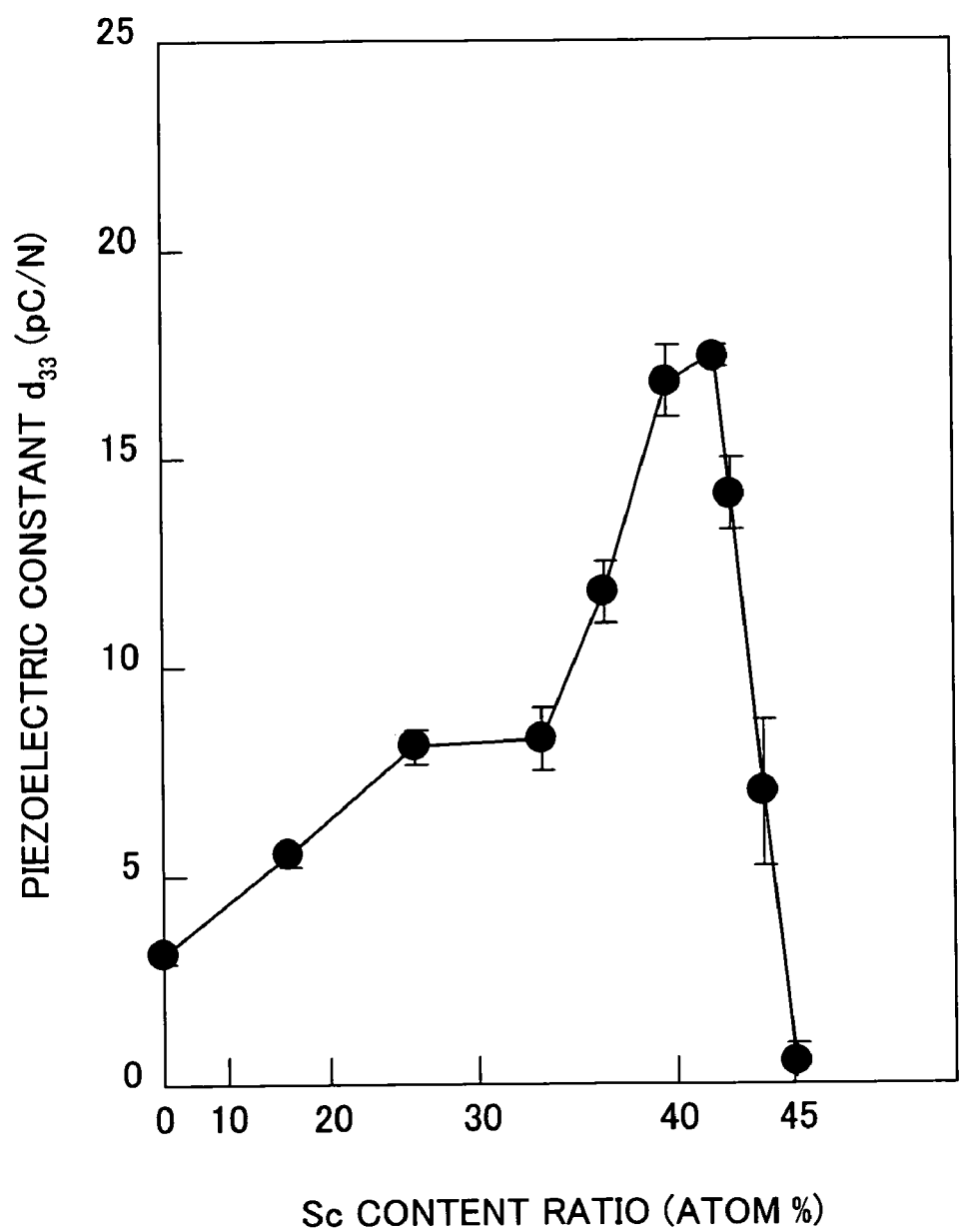
FIG. 4 is a diagram illustrating a relationship between a content ratio of scandium and a piezoelectric response of an Sc-containing aluminum nitride thin film in a case where an intermediate layer is provided.

The following explains how a piezoelectric response of the piezoelectric thin film 1*b* provided with the intermediate layer 4 varies, with reference to FIG. 4. FIG. 4 is a diagram illustrating a relationship between a content ratio of scandium and a piezoelectric response of the Sc-containing aluminum nitride thin film 3 in a case where the intermediate layer 4 is provided.

As illustrated in FIG. 4, the provision of the intermediate layer 4 can improve the piezoelectric response of the piezoelectric thin film 1b even in a case where the content ratio of scandium is greater than 35 atom % and smaller than 40 atom %. That is, deterioration of the piezoelectric response that is a problem in the piezoelectric thin film 1 of Embodiment 1 can be suppressed. This makes it unnecessary to precisely control composition of the Sc-containing aluminum nitride thin film 3 in production of a piezoelectric thin film. As a result, a piezoelectric thin film whose piezoelectric response is improved can be easily produced.

Moreover, by setting the content ratio of scandium in a range of 15 atom % to 45 atom %, a piezoelectric response of an aluminum nitride thin film can be improved. By setting the content ratio of scandium in the aforesaid range, the piezoelectric response of the Sc-containing aluminum nitride thin film 3 becomes approximately 6 pC/N to 18 pC/N. A general aluminum nitride thin film has a piezoelectric response of approximately 5.1 pC/N to 6.7 pC/N. Therefore, by setting the content ratio of scandium in the aforesaid range, the piezoelectric response can be improved approximately 1.1 to 3 times.

As a result, an operation of an RF-MEMS device at a low voltage can be realized when the RF-MEMS device includes the piezoelectric thin film 1b provided with the Sc-containing aluminum nitride thin film 3 that has a content ratio of scandium in the aforesaid range. Moreover, when an RF-MEMS actuator includes the piezoelectric thin film 1b, an operational range of the RF-MEMS actuator can be widened. Further, when an FBAR filter includes the piezoelectric thin film 1b, an insertion loss of the FBAR filter can be reduced. In addition, when the piezoelectric thin film 1b is applied to a physical sensor such as a gyro sensor, a pressure sensor, and an acceleration sensor, detection sensitivity of the sensor can be improved.

Therefore, when the content ratio of scandium is in the aforesaid range, it is possible to realize size reduction and power consumption saving of a device that includes the piezoelectric thin film 1b provided with the Sc-containing aluminum nitride thin film 3. Moreover, performance of the device can be improved.

As illustrated in FIGS. 5(b) through 5(e), the intermediate layer 4 may be an Sc-containing aluminum nitride thin film whose composition is different from that of the Sc-containing aluminum nitride thin film 3. By using, as the intermediate layer 4, the Sc-containing aluminum nitride thin film that has a different composition from that of the Sc-containing aluminum nitride thin film 3, it becomes possible to improve the piezoelectric response of the piezoelectric thin film 1b.

Figure 5A:
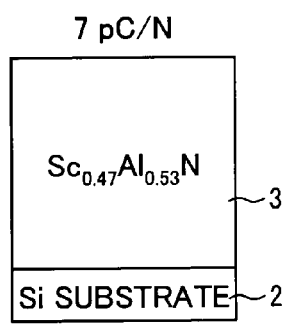
FIGS. 5(a) through 5(e) are diagrams that show specific examples of piezoelectric thin films of the present invention.
Figure 5B:
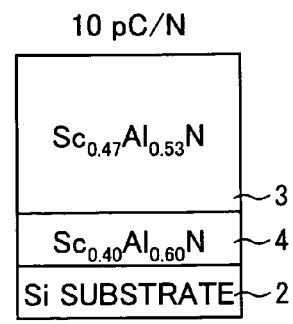
Figure 5C:
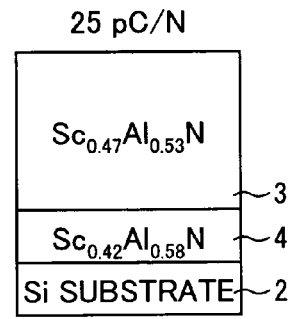

For example, as shown in FIG. 5(a), the piezoelectric thin film 1 that uses an $Sc_{0.47}Al_{0.53}N$ layer as the Sc-containing aluminum nitride thin film 3 exhibits a piezoelectric response of approximately 7 pC/N. On the other hand, as illustrated in FIG. 5(b), provision of an $Sc_{0.40}Al_{0.60}N$ layer as the intermediate layer 4 between the $Sc_{0.47}Al_{0.53}N$ layer and the substrate 2 improves the piezoelectric response of the piezoelectric thin film 1b to approximately 10 pC/N. Moreover, as illustrated in FIG. 5(c), provision of an $Sc_{0.42}Al_{0.58}N$ layer as the intermediate layer 4 drastically improves the piezoelectric response of the piezoelectric thin film 1b to 25 pC/N.

Figure 5D:
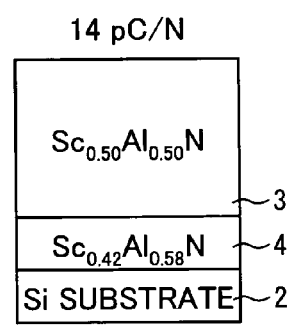

The piezoelectric thin film 1 that is provided with an $Sc_{0.50}Al_{0.50}N$ layer as the Sc-containing aluminum nitride layer 3 on the substrate 2 has a piezoelectric response of 0 pC/N. However, as illustrated in FIG. 5(d), by providing an $Sc_{0.42}Al_{0.58}N$ layer as the intermediate layer 4 so as to form the piezoelectric thin film 1b, the piezoelectric response can be improved from 0 pC/N to 14 pC/N.

That is, the piezoelectric response of the piezoelectric thin film can be drastically improved by using, as the intermediate layer 4, an Sc-containing aluminum nitride thin film whose composition is different from that of the Sc-containing aluminum nitride film 3.

The Sc-containing aluminum nitride thin film that has a different composition and is used as the intermediate layer 4 is not limited to one layer. A plurality of layers each made of the Sc-containing aluminum nitride thin film may be provided as the intermediate layer 4.

Figure 5E:
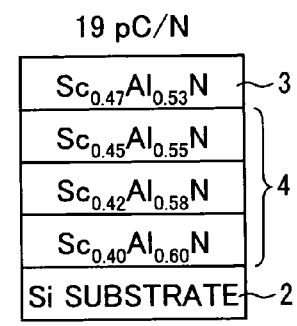

For example, as illustrated in FIG. 5(e), in the piezoelectric thin film 1b, the $Sc_{0.47}Al_{0.53}N$ layer is provided as the Sc-containing piezoelectric thin film 3 and three layers including an $Sc_{0.40}Al_{0.60}N$ layer, an $Sc_{0.42}Al_{0.58}N$ layer, and an $Sc_{0.45}Al_{0.55}N$ layer are provided as the intermediate layer 4 in this order on the substrate. This piezoelectric thin film 1b exhibits a piezoelectric response of approximately 19 pC/N. In this way, even in case where the intermediate layer 4 is made of a plurality of layers, the piezoelectric response of the piezoelectric thin film 1b can be improved.

As explained above, the Sc-containing aluminum nitride thin film 3 is provided on the substrate 2 via the intermediate layer 4. This not only improves the piezoelectric response of the piezoelectric thin film 1b but also prevents the piezoelectric response of the piezoelectric thin film itself from being largely deteriorated by a little variation in a content ratio of scandium. In other words, the provision of the intermediate layer 4 makes it easy to produce piezoelectric thin films that have a constant physical property. Note that the substrate 2 is not limited to an Si substrate though an Si substrate is used as the substrate 2 in FIGS. 5(a) through 5(e).

Embodiment 3

One embodiment of a fabrication method of a piezoelectric thin film 1 of Embodiment 1 is explained below as Embodiment 3, with reference to FIG. 6. Note that application of an Sc-containing aluminum nitride thin film is not specifically limited as long as the Sc-containing aluminum nitride thin film is used in a piezoelectric element that utilizes a piezoelectric phenomenon. For example, a piezoelectric thin film that includes the Sc-containing aluminum nitride thin film can be used in an SAW device or an RF-MEMS device. Moreover, in the present embodiment, the same terms as in Embodiment 1 have identical meanings.

A fabrication method of the piezoelectric thin film 1 includes a sputtering process in which scandium and aluminum are simultaneously sputtered onto a substrate 2 (for example, a silicon (Si) substrate) in a nitrogen gas ($N_2$) atmosphere or an atmosphere of a mixture of nitrogen gas ($N_2$) and argon gas (Ar). This makes it possible to form an Sc-containing aluminum nitride thin film 3 that is excellent in adhesiveness and has a high degree of purity. Moreover, by sputtering scandium and aluminum simultaneously, it becomes possible to produce the Sc-containing aluminum nitride thin film 3 in which scandium nitride and aluminum nitride are not unevenly distributed to a part but evenly distributed.

(Power Density Range that Improves Piezoelectric Response)

In the sputtering process, in case where a target power density of aluminum is fixed at 7.9 $W/cm^2$, a target power density of scandium is in a range of 0.05 $W/cm^2$ to 6.5 $W/cm^2$ or 8.5 $W/cm^2$ to 10 $W/cm^2$.

In the present specification and the like, "power density" is a value obtained by dividing a sputtering power by a target area. In the fabrication method of the piezoelectric thin film of the present invention, because scandium and aluminum are simultaneously sputtered, there are two target power densities including a target power density of scandium and a target power density of aluminum. In the present specification and the like, a target power density expressed simply as "target power density" indicates the target power density of scandium.

By setting the target power density in a range of 0.05 W/cm$^2$ to 6.5 W/cm$^2$ or 8.5 W/cm$^2$ to 10 W/cm$^2$, a piezoelectric response of the Sc-containing aluminum nitride thin film can be improved.

Figure 6:
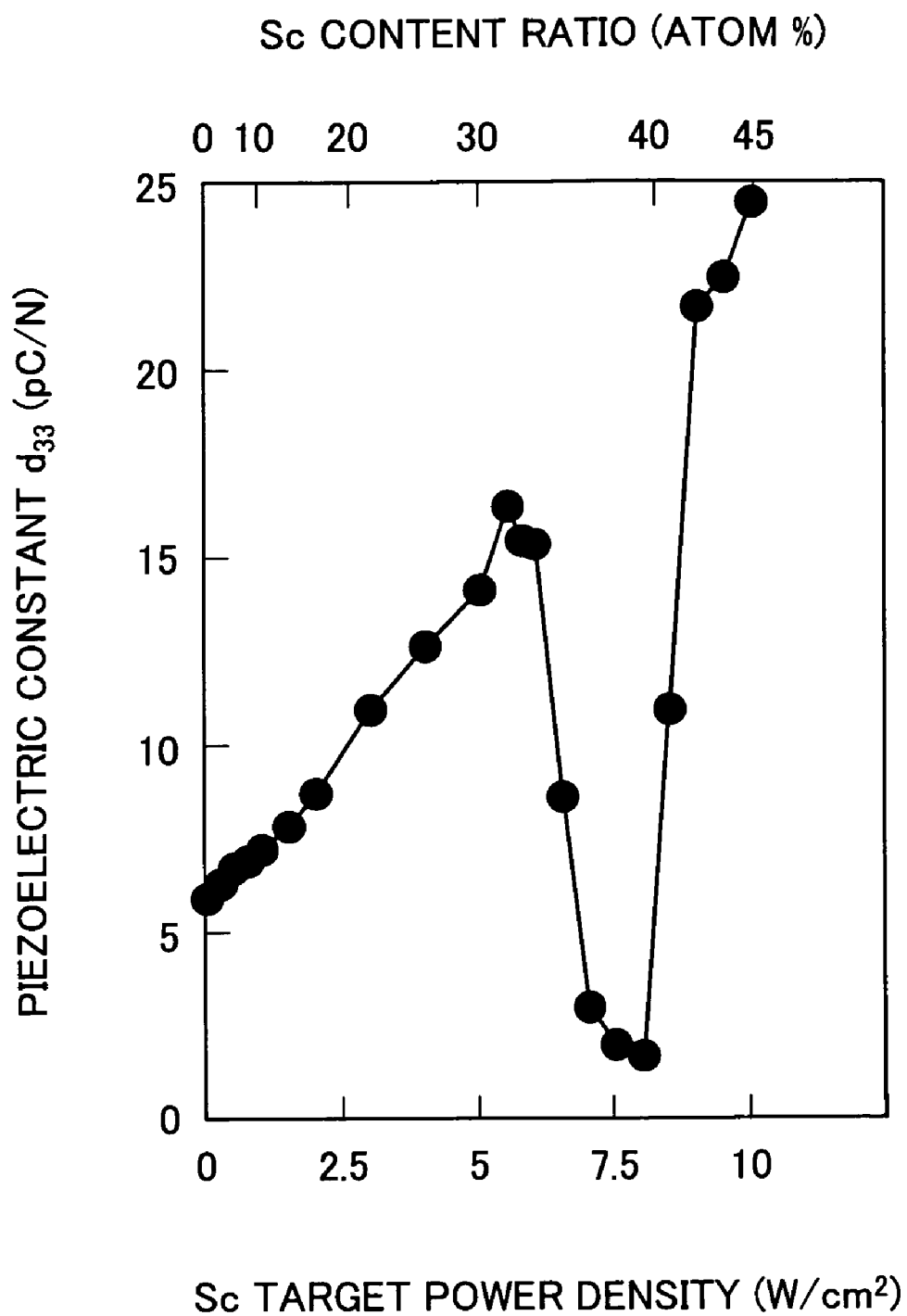
FIG. 6 is a diagram illustrating a relationship of a target power density of scandium, a content ratio of scandium, and a piezoelectric response of an Sc-containing aluminum nitride thin film.

That is, as illustrated in FIG. 6, a case where the target power density is in a range of 0.05 W/cm$^2$ to 6.5 W/cm$^2$ corresponds to a case where a content ratio of scandium is in a range of 0.5 atom % to 35 atom %. On the other hand, a case where the target power density is in the range of 8.5 W/cm$^2$ to 10 W/cm$^2$ corresponds to a case where the content ratio of scandium is in a range of 40 atom % to 50 atom %. FIG. 6 illustrates a relationship of the target power density, the content ratio of scandium, and the piezoelectric response of the Sc-containing aluminum nitride thin film.

As illustrated in FIG. 6, by setting the target power density in a range of 0.05 W/cm$^2$ to 6.5 W/cm$^2$ or 8.5 W/cm$^2$ to 10 W/cm$^2$, the content ratio of scandium is arranged in a range of 0.5 atom % to 35 atom % or 40 atom % to 50 atom %. As a result, a piezoelectric response of approximately 6 pC/N to 24.6 pC/N can be obtained. Accordingly, by setting the target power density in a range of 0.05 W/cm$^2$ to 6.5 W/cm$^2$ or 8.5 W/cm$^2$ to 10 W/cm$^2$, it becomes possible to obtain substantially the same effect as an effect of the piezoelectric thin film 1 that includes the Sc-containing aluminum nitride thin film 3 whose content ratio of scandium is in the range of 0.5 atom % to 35 atom % or 40 atom % to 50 atom %.

Note that other conditions in the sputtering process are not specifically limited as long as the target power density is in the aforesaid range. For example, a sputtering pressure and a sputtering time are set as appropriate.

(Substrate Temperature Range that Improves Piezoelectric Response)

Figure 7:
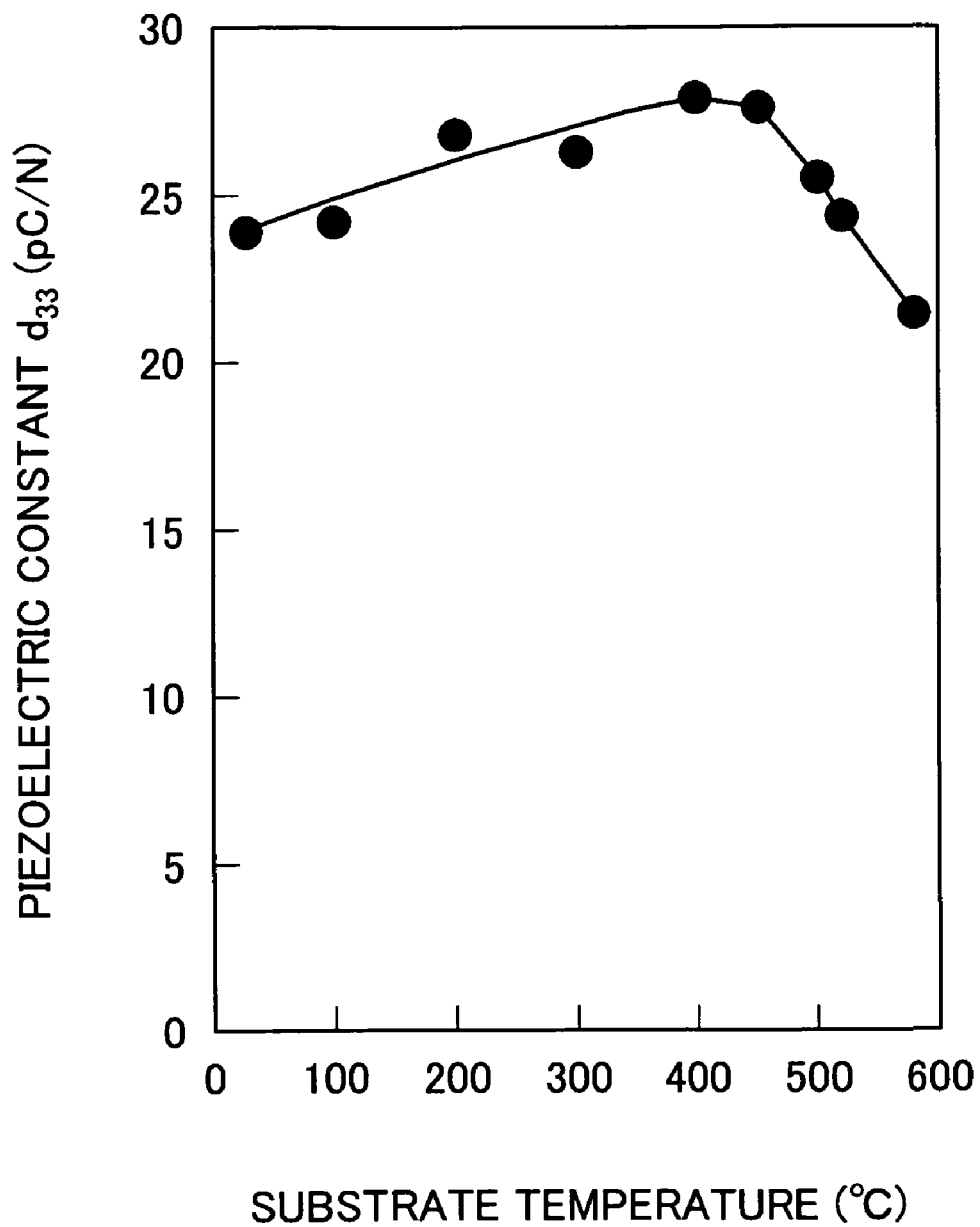
FIG. 7 is a diagram illustrating a relationship between a substrate temperature and a piezoelectric response of an Sc-containing aluminum nitride thin film.

When the target power density is set in the range of 0.05 W/cm$^2$ to 6.5 W/cm$^2$ or 8.5 W/cm$^2$ to 10 W/cm2 in the sputtering process, the piezoelectric response of the Sc-containing aluminum nitride thin film 3 can be further improved by varying a substrate temperature. FIG. 7 illustrates a relationship between the substrate temperature and the piezoelectric response of the Sc-containing aluminum nitride thin film 3.

As illustrated in FIG. 7, the piezoelectric response of the Sc-containing aluminum nitride thin film 3 can be improved by setting, in the sputtering process, the substrate temperature in a range of 20° C. to 600° C., more preferably, in a range of 200° C. to 450° C., and the most preferably, in a range of 400° C. to 450° C. Specifically, by setting the substrate temperature in the range of 20° C. to 600° C., a piezoelectric response of approximately 15 pC/N to 28 pC/N can be obtained. Moreover, by setting the substrate temperature in the range of 200° C. to 450° C., a piezoelectric response of approximately 26 pC/N to 28 pC/N can be obtained. Note that the substrate temperature in the range of 400° C. to 450° C. makes it possible to obtain the maximum piezoelectric response (approximately 28 pC/N) of the Sc-containing aluminum nitride thin film 3.

Therefore, by setting the substrate temperature in the aforesaid range in the sputtering process, it becomes possible to realize further size reduction and power consumption saving of a device including the piezoelectric thin film 1 that includes thus fabricated Sc-containing aluminum nitride thin film 3. Moreover, the performance of the device can be further improved.

(Power Density Range that Further Improves Piezoelectric Response)

In view of further improvement of the piezoelectric response, the target power density is preferably set in a range of 9.5 W/cm$^2$ to 10 W/cm$^2$ among the aforesaid range, and more preferably at 10 W/cm$^2$. As illustrated in FIG. 6, the piezoelectric response can be further improved by setting the target power density in the range of 9.5 W/cm$^2$ to 10 W/cm$^2$. In particular, when the target power density is at 10 W/cm$^2$, the content ratio of scandium in the Sc-containing aluminum nitride thin film 3 becomes 45 atom % and the piezoelectric response becomes a maximum value (24.6 pC/N). In other words, when the target power density is at 10 W/cm$^2$, the substantially same effect as in a case where the content ratio of scandium is 45 atom % can be obtained.

Note that the content ratio of scandium at which the piezoelectric response becomes maximum shows a measurement error of approximately ±5 atom %, depending on a condition such as a measurement condition.

(Fabrication Method of Piezoelectric Thin Film 1b Including Intermediate Layer 4)

A fabrication method of the piezoelectric thin film 1 of Embodiment 1 is explained above. In the same fabrication method, a piezoelectric thin film 1b of Embodiment 2 can be fabricated.

The fabrication method of the piezoelectric thin film 1b is different from the fabrication method of the piezoelectric thin film 1 in that the fabrication method of the piezoelectric thin film 1b includes an intermediate layer forming step for forming the intermediate layer 4 on the substrate 2. A method of forming the intermediate layer 4 can be chosen as appropriate according to a material that is to be used as the intermediate layer 4. Examples of the method of forming the intermediate layer 4 are sputtering, vacuum deposition, ion plating, chemical vapor deposition (CVD), molecular beam epitaxy (MBE), laser ablation, and plating.

Figure 8:
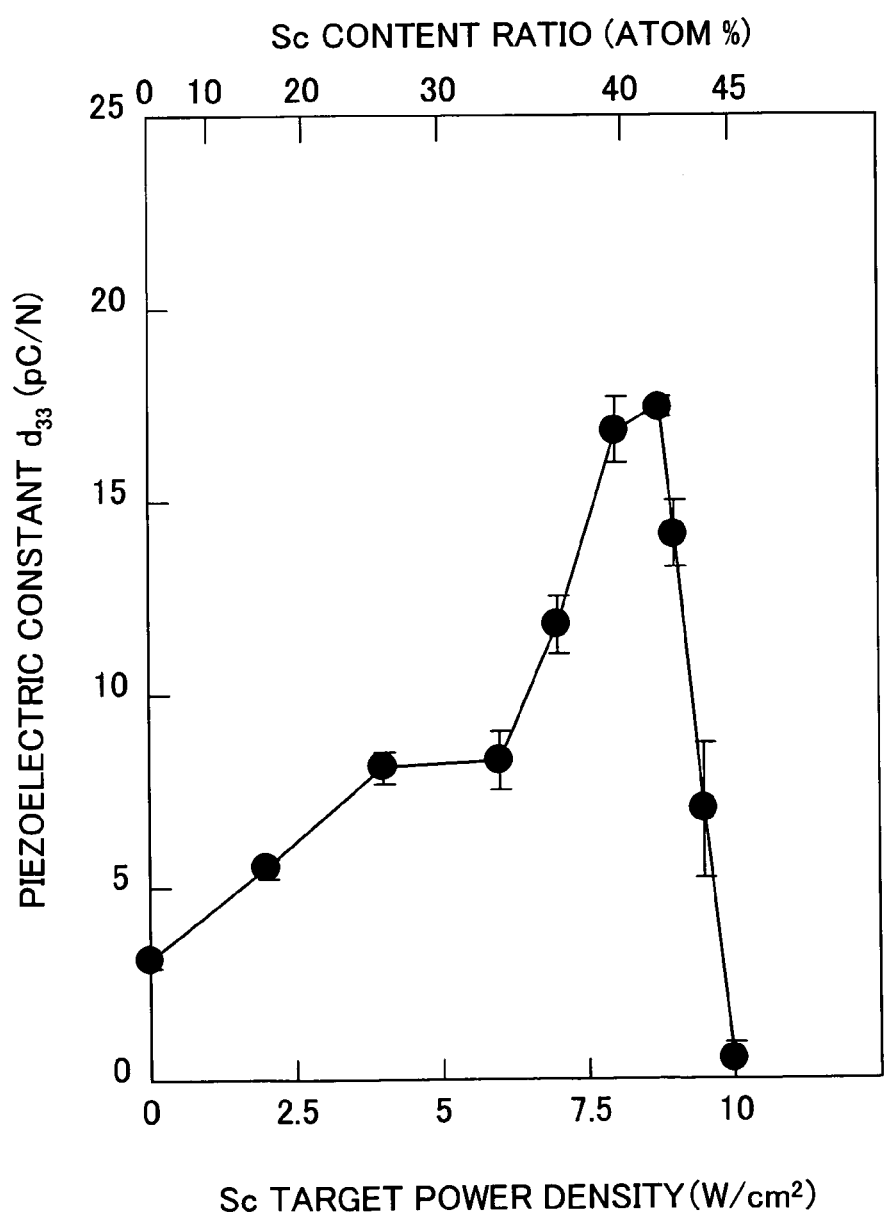
FIG. 8 is a diagram illustrating a relationship of a target power density of scandium, a content ratio of scandium, and a piezoelectric response of an Sc-containing aluminum nitride thin film in a piezoelectric thin film that includes an intermediate layer.

FIG. 8 illustrates a relationship of a target power density of scandium, a content ratio of scandium, and a piezoelectric response of an Sc-containing aluminum nitride thin film in the piezoelectric thin film 1b that is provided with the intermediate layer 4. FIG. 8 is a diagram illustrating a case where titanium nitride (TiN) is used as the intermediate layer 4.

As illustrated in FIG. 8, deterioration of the piezoelectric response can be prevented by providing the intermediate layer 4 in a case where the content ratio of scandium is greater than 35 atom % and smaller than 40 atom %, that is, the target power density is greater than 6.5 W/cm$^2$ and smaller than 8.0 W/cm$^2$, although the piezoelectric response deteriorates in a case where the intermediate layer 4 is not provided.

Note that the intermediate layer 4 may be formed by the same method as the method of forming the Sc-containing aluminum nitride thin film 3, in case where the intermediate layer 4 employs Sc-containing aluminum nitride whose composition is different from that of the Sc-containing aluminum nitride thin film 3.

Embodiment 4

The following explains one embodiment of a piezoelectric thin film resonator that includes a piezoelectric thin film of the present invention as Embodiment 4. Specific application of the piezoelectric thin film resonator that includes the piezoelectric thin film of the present invention is not specifically limited. In the present embodiment, an explanation is given by using, as an example, a case where a piezoelectric thin film 1 including an Sc-containing aluminum nitride thin film is applied to an FBAR filter that is one of RF-MEMS devices. Note that obviously the present embodiment may employ a piezoelectric thin film 1b although the present embodiment explains an FBAR filter that employs the piezoelectric thin film 1. Further, the same terms as in Embodiments 1 through 3 have identical meanings.

Figure 9:
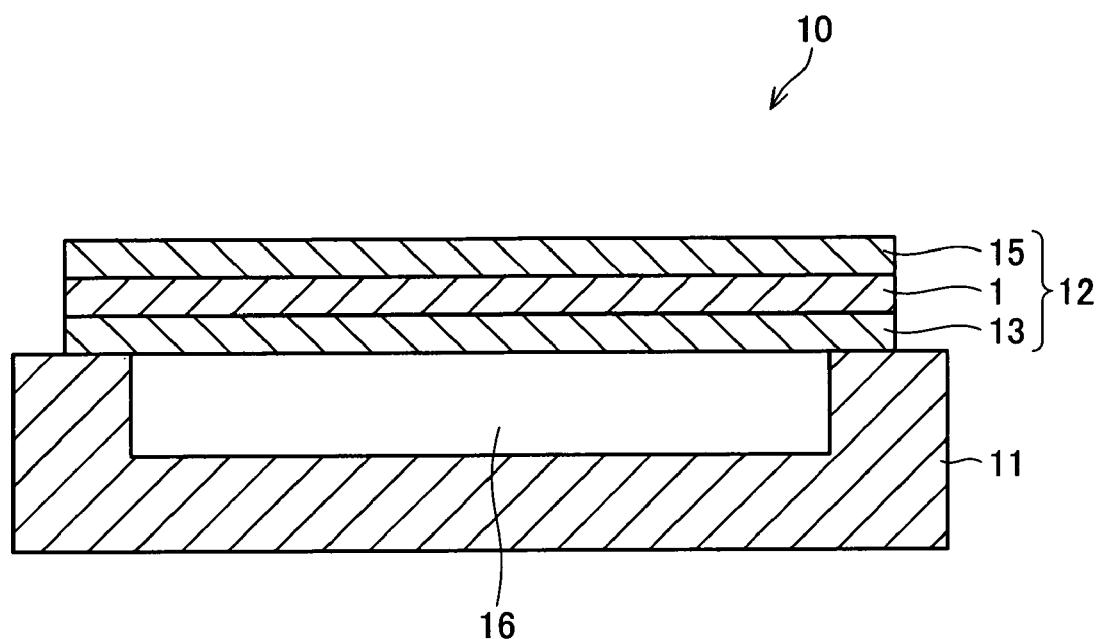
FIG. 9 is a cross sectional view schematically illustrating an FBAR filter of Embodiment 4.

The following explains an FBAR filter 10 (piezoelectric thin film resonator) of the present embodiment, with reference to FIG. 9.

(Structure of FBAR Filter 10)

As illustrated in FIG. 9, the FBAR filter 10 includes a substrate 11, and a piezoelectric laminate structure 12 that is formed on the substrate 11. FIG. 9 is a cross sectional view schematically illustrating the FBAR filter 10.

(Substrate 11)

The substrate 11 is a substrate that supports the piezoelectric laminate structure 12. A cavity section 16 is provided below the piezoelectric laminate structure 12 so that the piezoelectric laminate structure 12 vibrates freely.

A material of the substrate 11 is not specifically limited, as long as the material can support the piezoelectric laminate structure 12 so that the piezoelectric laminate structure 12 is not deformed. Examples of the material are silicon (Si) single crystal or a material obtained by forming a polycrystalline film made of silicon, diamond, or the like on a surface of a base made of Si single crystal or the like.

Moreover, examples of a method of forming the cavity section 11 may be an anisotropic etching method and a deep reactive anisotropic etching method.

(Structure of Piezoelectric Laminate Structure 12)

The piezoelectric laminate structure 12 includes a lower electrode 13, an upper electrode 15, and a piezoelectric thin film 14 that is sandwiched by the lower electrode 13 and the upper electrode 15. Each member is explained below.

(Lower Electrode 13 and Upper Electrode 15)

The lower electrode 13 and the upper electrode 15 are electrodes to apply an alternate electric field to the piezoelectric thin film 14. Examples of a material of the lower electrode 13 and the upper electrode 15 are molybdenum (Mo), tungsten (W), aluminum (Al), a laminate film made of platinum and titanium (Pt/Ti), and a laminate film made of gold and chrome (Au/Cr). Among these materials, it is preferable to use molybdenum that has the lowest scattering elastic loss.

Moreover, a preferable thickness of the lower electrode 13 and the upper electrode 15 is in a range of 50 nm to 200 nm. By setting the thickness of the lower electrode 13 and the upper electrode 15 in the aforesaid range, a loss can be reduced. A conventionally known method can be employed as a method of forming the lower electrode 13 and the upper electrode 15. For example, a sputtering method, a vapor deposition method, or the like can be used.

(Piezoelectric Thin Film 1)

The piezoelectric thin film 1 is explained in detail in Embodiments 1 and 3, and the explanation thereof is omitted in the present embodiment. Note that a preferable thickness of the piezoelectric thin film 1 is in a range of 0.1 µm to 30 µm. By arranging the thickness of the piezoelectric thin film 1 to be in the aforesaid range, the piezoelectric thin film 1 can become excellent in adhesiveness.

(Supplementary Explanation)

Note that the FBAR filter 10 may include an underlayer film between the substrate 11 and the lower electrode 13. The underlayer film is an insulating film. An example of the underlayer film may be a dielectric film that contains silicon oxide (SiO$_2$) or silicon nitride as a main component, or a laminate film of silicon oxide and silicon nitride. The "main component" in the present specification and the like means a component of more than 50 weight % among all components that the dielectric film contains.

The dielectric film may be made of a single layer film or a multilayer film in which a layer that increases adhesiveness or the like is added. Moreover, a preferable thickness of the underlayer film is in a range of 0.05 µm to 2.0 µm.

The underlayer film can be formed by a conventionally known method. For example, the underlayer film can be formed by a thermal oxidation method and a chemical vapor deposition method (CVD) on a surface of the substrate 11 that is made of silicon.

Embodiment 5

The following explains one embodiment of an actuator element that includes a piezoelectric thin film of the present invention as Embodiment 5. A specific application of the actuator element that includes the piezoelectric thin film of the present invention is not specifically limited. The present embodiment explains, as an example, a case where a piezoelectric thin film 1 that includes an Sc-containing aluminum nitride thin film 3 is used in a switch that is one of RF-MEMS devices. Note that obviously the present embodiment may employ a piezoelectric thin film 1b although the present embodiment explains an RF-MEMS device that employs the piezoelectric thin film 1. Further, the same terms as in Embodiments 1 through 4 have identical meanings.

(Switch 20)

Figure 10A:
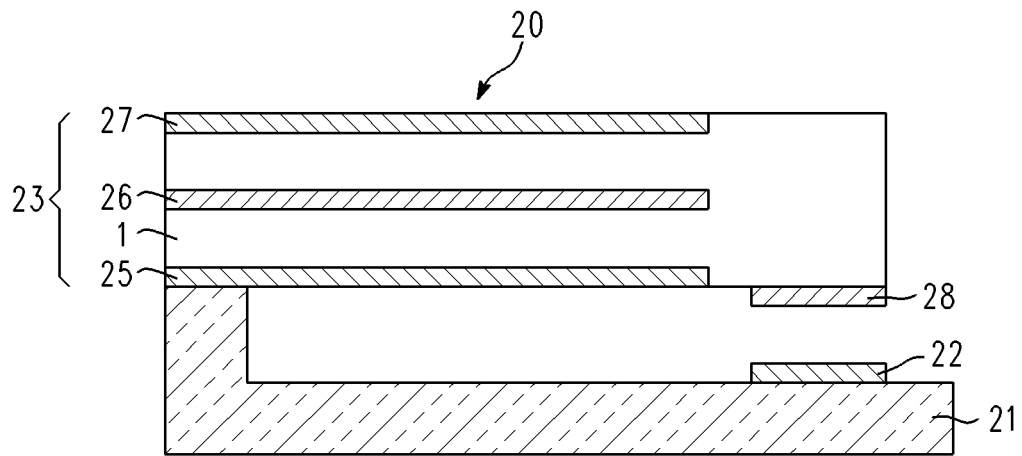
FIGS. 10(a) and 10(b) are cross sectional views of a switch of Embodiment 5.
Figure 10B:
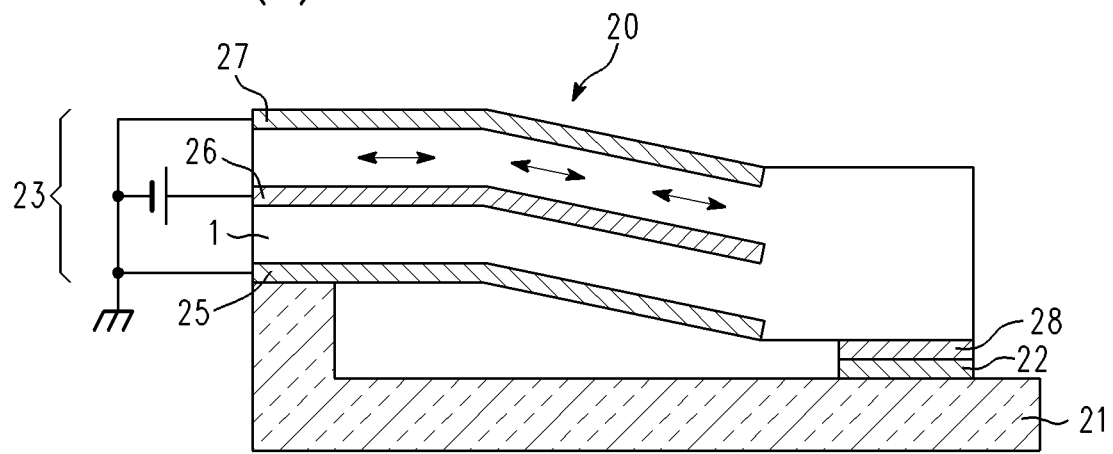

The following explains a switch 20 (actuator element) of the present embodiment, with reference to FIGS. 10(a) and 10(b). FIGS. 10(a) and 10(b) are cross sectional views schematically illustrating the switch 20. FIG. 10(a) is a diagram illustrating a state where a voltage is not applied. FIG. 10(b) is a diagram illustrating a state where a voltage is applied.

As illustrated in FIGS. 10(a) and 10(b), the switch 20 mainly includes a substrate 21, a lower electrode 22, and a movable section 23.

(Substrate 21)

The substrate 21 is a substrate that holds a fixed electrode 22 and the movable section 23. One end section of the substrate 21 is provided with the lower electrode 22 and an end section on a side that opposes the end section provided with the lower electrode 22 holds the movable section 23.

A material of the substrate 21 is not specifically limited, as long as the material can hold the lower electrode 22, a dielectric film, and the movable section 23 so that the lower electrode 22, the dielectric film, and the movable section 23 are not deformed. The material of the substrate 21 may be, for example, silicon (Si) single crystal or a material obtained by forming a polycrystalline film made of silicon, diamond or the like on a surface of a base made of Si single crystal or the like.

(Lower Electrode 22)

The lower electrode 22 is an electrode that comes into contact with the upper electrode 28 explained below, when the switch 20 is turned on, that is, in an ON state.

Examples of a material of the lower electrode 22 are molybdenum (Mo), tungsten (W), aluminum (Al), copper (Cu), nickel (Ni), a laminate film made of platinum and titanium (Pt/Ti), and a laminate film made of gold and chrome (Au/Cr).

A conventionally known method can be used as a method of forming the lower electrode 22. For example, a sputtering method, a vapor deposition method, or the like can be used as the method of forming the lower electrode 22.

(Structure of Movable Section 23)

As illustrated in FIGS. 10(*a*) and 10(*b*), the movable section 23 includes a piezoelectric thin film 1, a first movable electrode 25, a second movable electrode 26, a third movable electrode 27, and the upper electrode 28. Each member is explained below. Note that the piezoelectric thin film 1 is explained in detail in Embodiments 1 and 2, and explanation thereof is omitted.

(First Movable Electrode 25, Second Movable Electrode 26, and Third Movable Electrode 27)

The first movable electrode 25, the second movable electrode 26, and the third movable electrode 27 are electrodes that are used at application of a voltage for driving the piezoelectric thin film 1. The piezoelectric thin film 1 is sandwiched by the first movable electrode 25 and the second movable electrode 26 and by the second movable electrode 26 and the third movable electrode 27.

Examples of a material of the first movable electrode 25, the second movable electrode 26, and the third movable electrode 27 are molybdenum (Mo), tungsten (W), aluminum (Al), copper (Cu), nickel (Ni), a laminate film made of platinum and titanium (Pt/Ti), and a laminate film made of gold and chrome (Au/Cr).

A conventionally known method can be used as a method of forming the first movable electrode 25, the second movable electrode 26, and the third movable electrode 27. For example, a sputtering method, a vapor deposition method, or the like can be used as the method of forming the first movable electrode 25, the second movable electrode 26, and the third movable electrode 27.

(Upper Electrode 28)

The upper electrode 28 is provided to an end section on a side opposing an end section of the movable section 23 which end section is held by the substrate 21. The upper electrode 28 comes into contact with the lower electrode 22 when the movable section 23 moves.

Examples of a material of the upper electrode 28 are molybdenum (Mo), tungsten (W), aluminum (Al), copper (Cu), nickel (Ni), a laminate film made of platinum and titanium (Pt/Ti), and a laminate film made of gold and chrome (Au/Cr).

A conventionally known method can be used as a method of forming the upper electrode 28. For example, a sputtering method, a vapor deposition method, or the like can be used as the method of forming the upper electrode 28.

(Operation of Switch 20)

As illustrated in FIG. 10(*b*), the switch 20 switches from a state in which the switch 20 is turned off to a state in which the switch 20 is turned on, in response to application of a voltage to the first movable electrode 25, the second movable electrode 26, and the third movable electrode 27. That is, a state of the switch 20 changes from an "OFF" state to an "ON" state.

More specifically, in response to application of a voltage to the first movable electrode 25, the second movable electrode 26, and the third movable electrode 27, the piezoelectric thin film 1 extends/contracts and the movable section 23 is driven toward the substrate 21, for example, as illustrated in FIG. 10(*b*). As a result, the lower electrode 22 and the upper electrode 28 come into contact with each other. This changes the switch 20 from an "OFF" state to an "ON" state.

Embodiment 6

The following explains, as Embodiment 6, one embodiment of a physical sensor that includes a piezoelectric thin film of the present invention. A specific application of the physical sensor that includes the piezoelectric thin film of the present invention is not specifically limited. The present embodiment explains, as an example, a case where a piezoelectric thin film 1 that includes an Sc-containing aluminum nitride thin film 3 is used in a physical sensor. Note that, obviously, the present embodiment may employ a piezoelectric thin film 1*b* although the present embodiment explains a physical sensor that employs the piezoelectric thin film 1. Further, the same terms as in Embodiments 1 through 5 have identical meanings.

(Pressure Sensor 30)

Figure 11A:
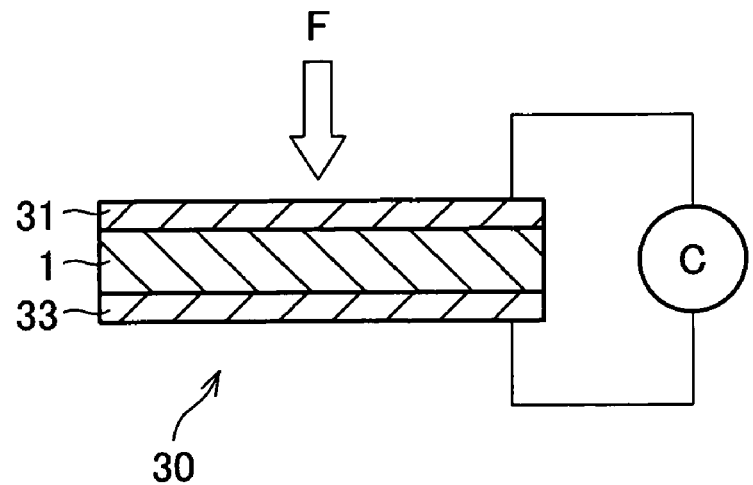
FIGS. 11(a) and 11(b) are cross sectional views schematically illustrating a pressure sensor of Embodiment 6.
Figure 11B:
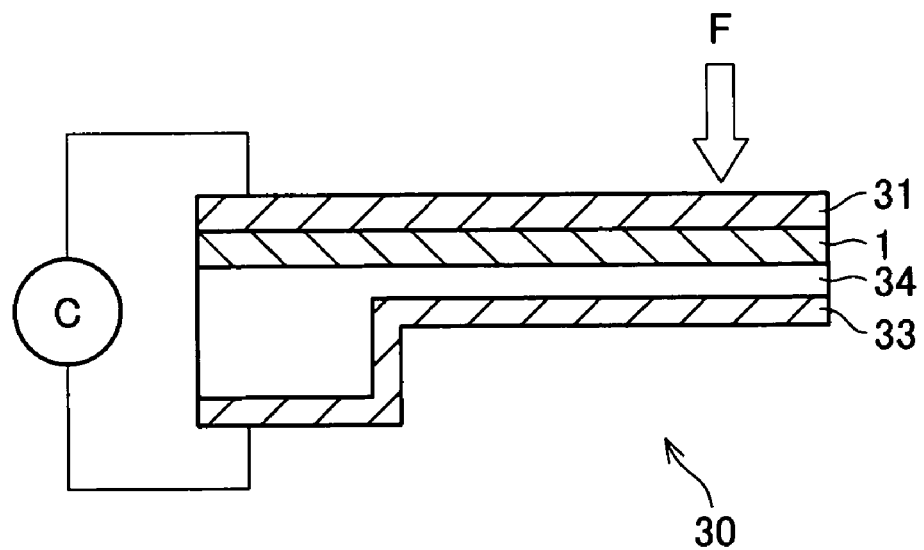

The following explains a pressure sensor 30 of the present embodiment, with reference to FIGS. 11(*a*) and 11(*b*). FIGS. 11(*a*) and 11(*b*) are cross sectional views schematically illustrating the pressure sensor 30. FIG. 11(*a*) is a diagram illustrating a case where a piezoelectric thin film is provided between an upper electrode and a lower electrode. FIG. 11(*b*) is a diagram illustrating a case where a supporting section is provided between the piezoelectric thin film and the lower electrode.

As illustrated in FIG. 11(*a*), the pressure sensor 30 of the present embodiment mainly includes an upper electrode 31, the piezoelectric thin film 1, and a lower electrode 33. Each component is explained below. Note that the piezoelectric thin film 1 is explained in Embodiments 1 and 3, and the explanation thereof is omitted in the present embodiment.

(Upper Electrode 31 and Lower Electrode 33)

The upper electrode 31 and the lower electrode 33 serve as electrodes in the pressure sensor 30. As illustrated in FIG. 11(*a*), the upper electrode 31 and the lower electrode 33 are formed so as to sandwich the piezoelectric thin film 1.

It is not specifically limited whether to form a cathode or anode by the upper electrode 31 and whether to form a cathode or anode by the lower electrode 33. This can be determined as appropriate.

A material of the upper electrode 31 and the lower electrode 33 is not specifically limited as long as the material can extract without loss an electric charge that is produced in the piezoelectric thin film 1. Examples of the material of the upper electrode 31 and the lower electrode 33 are molybdenum (Mo), tungsten (W), aluminum (Al), copper (Cu), nickel (Ni), a laminate film made of platinum and titanium (Pt/Ti), and a laminate film made of gold and chrome (Au/Cr).

A conventionally known method can be used as a method of forming the upper electrode 31 and the lower electrode 33. For example, a sputtering method, a vapor deposition method, or the like can be used as the method of forming the upper electrode 31 and the lower electrode 33.

(Operation of Pressure Sensor 30)

As illustrated in FIG. 11(*a*), when a pressure F is applied to the pressure sensor 30, the piezoelectric thin film 1 produces an electric charge according to a pressure applied. The produced electric charge is extracted by the upper electrode 31 and the lower electrode 33, and sent to a condenser (capacitor). In other words, the pressure sensor 30 can measure an electric potential of the extracted electric charge in the condenser. Therefore, a size of the applied pressure. F can be measured by the potential measured.

(Modification Example of Pressure Sensor 30)

As illustrated in FIG. 11(*b*), the pressure sensor 30 may include a supporting section 34 between the piezoelectric thin film 1 and the lower electrode 33.

The supporting section 34 is used as a monomorph and made of metal, polymer, ceramics, or the like. The provision of the supporting section 34 allows the pressure sensor 30 to have an increased sensitivity.

In the present embodiment, a pressure sensor is explained as one example of a physical sensor. The physical sensor is not limited to this. The physical sensor may be, for example, a gyro sensor or an acceleration sensor.

The present invention is not limited to the description of the embodiments above, but may be altered by a skilled person within the scope of the claims. An embodiment based on a proper combination of technical means disclosed in different embodiments is encompassed in the technical scope of the present invention.

The following shows Examples and explains the Embodiments of the present invention in further detail. Obviously, the present invention is not limited to the following examples. Various modifications are possible in detailed sections.

EXAMPLES

Example 1

(Fabrication Method of Aluminum Nitride Thin Film to Which Scandium is Added)

An Sc-containing aluminum nitride thin film was fabricated on a silicon substrate by sputtering aluminum and scandium onto the silicon substrate in a nitrogen atmosphere. Conditions of the sputtering were: an aluminum target power density: 7.9 $W/cm^2$; a scandium target power density: 0 $W/cm^2$ to 10 $W/cm^2$; a substrate temperature: 580° C.; a nitrogen gas concentration: 40%; and a sputtering time: 4 hours. Note that a target power density of 0 W means that no scandium was added to the aluminum nitride thin film.

(Measurement Method of Piezoelectric Response)

A piezoelectric response of the Sc-containing aluminum nitride thin film was measured by using a piezometer. The measurement was carried out by using a frequency of 110 Hz under a pressure of 0.25N.

Comparative Example 1

An Aluminum nitride thin film was fabricated by using the same method as in Example 1 other than that magnesium (Mg) was used in lieu of scandium and a target power density was set in a range of 0 $W/cm^2$ to 2 $W/cm^2$, and a piezoelectric response of thus fabricated aluminum nitride thin film was measured.

Comparative Example 2

An Aluminum nitride thin film was fabricated by using the same method as in Example 1 other than that boron (B) was used in lieu of scandium and a target power density was set in a range of 0 $W/cm^2$ to 7.6 $W/cm^2$, and a piezoelectric response of thus fabricated aluminum nitride thin film was measured.

Comparative Example 3

An Aluminum nitride thin film was fabricated by using the same method as in Example 1 other than that silicon (Si) was used in lieu of scandium and a target power density was set in a range of 0 $W/cm^2$ to 1.5 $W/cm^2$, and a piezoelectric response of thus fabricated aluminum nitride thin film was measured.

Comparative Example 4

An Aluminum nitride thin film was fabricated by using the same method as in Example 1 other than that titanium (Ti) was used in lieu of scandium and a target power density was set in a range of 0 $W/cm^2$ to 1.8 $W/cm^2$, and a piezoelectric response of thus fabricated aluminum nitride thin film was measured.

Comparative Example 5

An Aluminum nitride thin film was fabricated by using the same method as in Example 1 other than that chrome (Cr) was used in lieu of scandium and a target power density was set in a range of 0 $W/cm^2$ to 0.8 $W/cm^2$, and a piezoelectric response of thus fabricated aluminum nitride thin film was measured.

Measurement Results of Example 1 and Comparative Examples 1 through 5

Figure 12A:
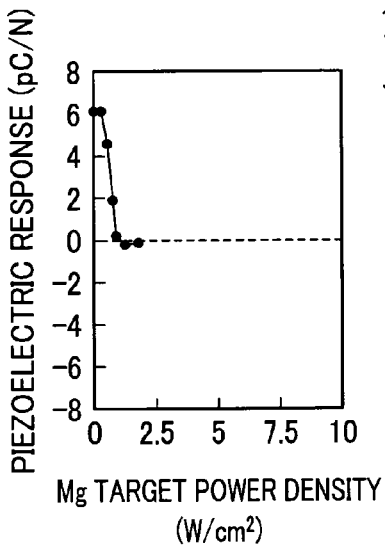
FIGS. 12(a) through 12(e) are diagrams each illustrating a relationship between a target power density and a piezoelectric response.
Figure 12B:
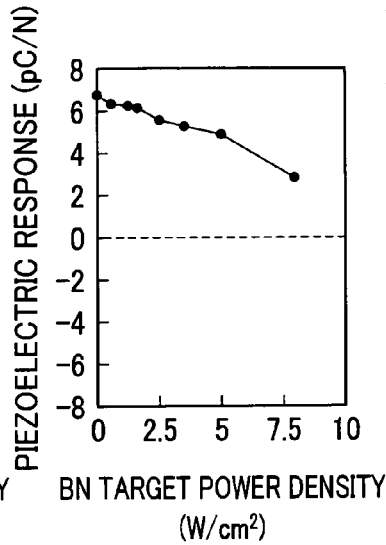
Figure 12C:
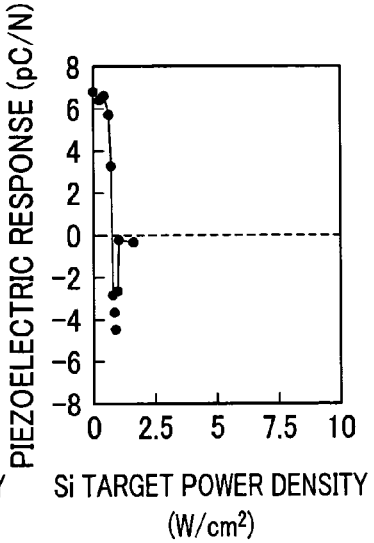
Figure 12D:
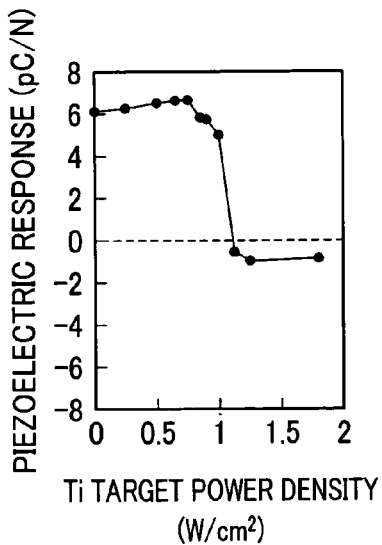
Figure 12E:
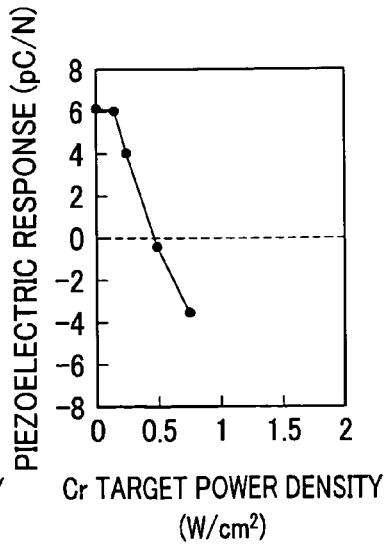

A measurement result in Example 1 is explained above, and the explanation thereof is omitted here. Measurement results of Comparative Examples 1 through 5 are shown in FIGS. 12(a) through 12(e). FIGS. 12(a) through 12(e) are diagrams each illustrating a relationship between the target power density and the piezoelectric response. FIG. 12(a) illustrates a case where magnesium was added. FIG. 12(b) illustrates a case where boron was added. FIG. 12(c) illustrates a case where silicon was added. FIG. 12(d) illustrates a case where titanium was added. FIG. 12(e) illustrates a case where chrome was added.

As illustrated in FIGS. 12(a) through 12(e), when an element other than scandium was added, the piezoelectric response of the aluminum nitride thin film only decreased but did not improve. Note that FIG. 6 shows that the aluminum nitride thin film that has a power density in a range of 6.5 $W/cm^2$ to 8.5 $W/cm^2$, that is, a content ratio of scandium in a range of 35 atom % to 40 atom % has a piezoelectric response lower than a piezoelectric response of an aluminum nitride thin film that does not contain scandium.

Example 2

A surface roughness of an Sc-containing aluminum nitride thin film whose content of scandium (hereinafter, referred to as Sc-content) was 25 atom % was measured.

A method of measuring the surface roughness employed an atom force microscope (AFM). Note that the "surface roughness" in the present specification and the like means arithmetic average roughness (Ra).

Comparative Example 6

A surface roughness was measured by the same method as the method used in Example 2 other than that an aluminum nitride thin film that did not contain an aluminum nitride thin film (an aluminum nitride thin film having an Sc-content of 0 atom %) was used.

Comparative Example 7

A surface roughness was measured by the same method as the method used in Example 2 other than that the Sc-content was set to 38 atom %.

Comparative Example 8

A surface roughness was measured by the same method as the method used in Example 2 other than that the Sc-content was set to 42 atom %.

[Results of Measuring Surface Roughnesses]

Figure 13A:
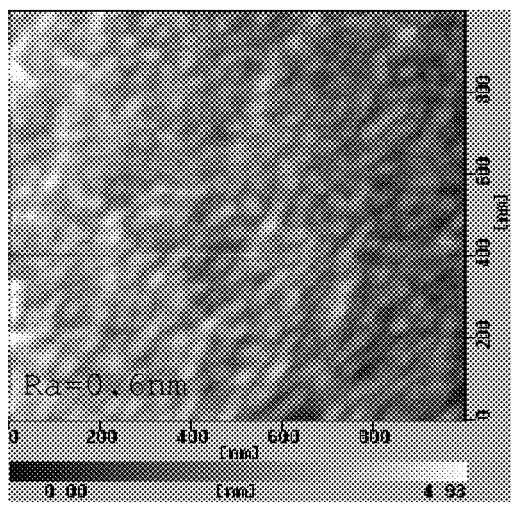
FIGS. 13(a) through 13(d) are diagrams each illustrating a surface form of an Sc-containing aluminum nitride thin film or an aluminum nitride thin film under an atom force microscope (AFM).
Figure 13B:
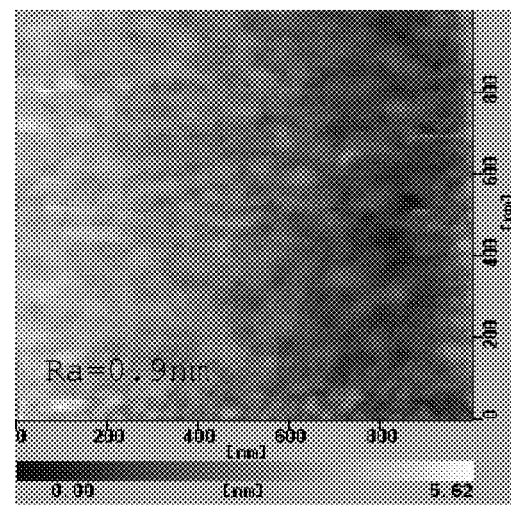
Figure 13C:
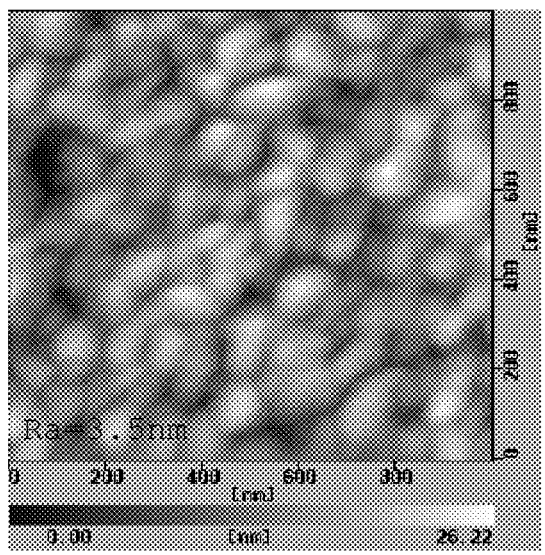
Figure 13D:
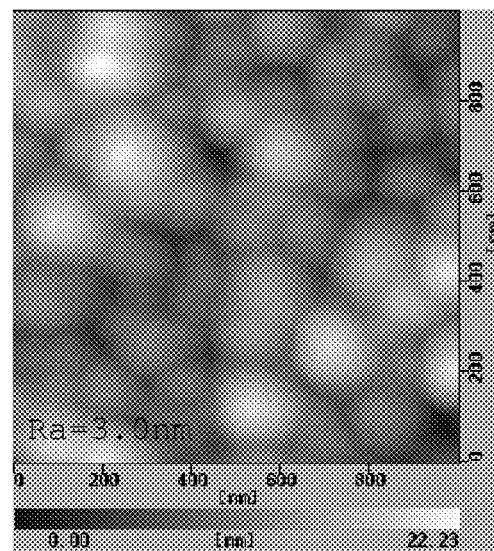

FIGS. 13(a) through 13(d) show results of measuring surface roughnesses in Example 2 and Comparative Examples 6 through 8, respectively. FIGS. 13(a) through 13(d) are diagrams each showing a result of observation of surface roughness under an atom force microscope in Example 2 and Comparative Examples 6 through 8. FIG. 13(a) illustrates a case where the Sc-content was set to 25 atom %. FIG. 13(b) is a case where the Sc-content was set to 0 atom %. FIG. 13(c) is a case where the Sc-content was set to 38 atom %. FIG. 13(d) is a case where the Sc-content was set to 42 atom %.

In case where the Sc-content was set to 25 atom %, that is, in the case of FIG. 13(a), the surface roughness Ra was 0.6 nm. On the other hand, in case where the Sc-content was set to 0 atom %, that is, in the case of FIG. 13(b), the surface roughness Ra was approximately 0.9 nm. This showed that the surface roughness could be lowered by setting an amount of Sc to be added in a range of 0.5 atom % to 35 atom %.

In cases where the Sc-contents were set to 38 atom % and 42 atom %, respectively, that is, in the cases shown in FIGS. 13(c) and 13(d), the surface roughnesses were 3.5 nm and 3.0 nm, respectively. This showed that the surface roughness increased by more than approximately 5 times as large as that in a case where the Sc-content was set to 25 atom %.

The piezoelectric thin film of the present invention includes an aluminum nitride thin film that contains scandium in a range from 0.5 atom % to 50 atom %. This produces an effect that is not obtainable by using a piezoelectric thin film that includes a conventional aluminum nitride thin film.

Specifically, by providing the piezoelectric thin film of the present invention in a device, for example, an RF-MEMS device, size reduction and power consumption saving of the RF-MEMS device can be realized. Moreover, the performance of the RF-MEMS device can be improved. Further, in case where the piezoelectric thin film of the present invention is provided to a physical sensor such as a gyro sensor, a pressure sensor, and an acceleration sensor, detection sensitivity of the physical sensor can be improved.

The piezoelectric thin film of the present invention can be suitably applied to a device such as an RF-MEMS device or the like that utilizes a piezoelectric phenomenon. Moreover, the RF-MEMS device that includes the piezoelectric thin film of the present invention is suitably applied to small-sized and high-performance electric apparatuses such as a mobile phone.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A piezoelectric thin film comprising an aluminum nitride thin film provided on a substrate and containing scandium,
    a content ratio of the scandium being in a range of 15 atom % to 45 atom % on an assumption that a total amount of a number of atoms of the scandium and a number of atoms of aluminum in the aluminum nitride thin film is 100 atom %,
    the aluminum nitride thin film and the substrate sandwiching at least one layer of an intermediate layer, and
    the intermediate layer being another aluminum nitride thin film containing scandium at a content ratio different from that of the aluminum nitride thin film.

2. An actuator element comprising a piezoelectric thin film as set forth in claim 1.

3. A physical sensor comprising a piezoelectric thin film as set forth in claim 1.

4. A piezoelectric thin film resonator comprising a piezoelectric thin film as set forth in claim 1.

5. A filter comprising a piezoelectric thin film resonator as set forth in claim 4.

6. A piezoelectric thin film comprising an aluminum nitride thin film containing scandium,
    a content ratio of the scandium being in a range of 10 atom % to 35 atom % or 40 atom % to 50 atom % on an assumption that a total amount of a number of atoms of the scandium and a number of atoms of aluminum in the aluminum nitride thin film is 100 atom %.

7. A piezoelectric material comprising an aluminum nitride thin film provided on a substrate and containing scandium,
    a content ratio of the scandium being in a range of 15 atom % to 45 atom % on an assumption that a total amount of a number of atoms of the scandium and a number of atoms of aluminum in the aluminum nitride is 100 atom %,
    the aluminum nitride thin film and the substrate sandwiching at least one layer of an intermediate layer, and
    the intermediate layer being another aluminum nitride thin film containing scandium at a content ratio different from that of the aluminum nitride thin film.

8. The A piezoelectric material comprising an aluminum nitride that contains scandium,
    a content ratio of the scandium being in a range of 10 atom % to 35 atom % or 40 atom % to 50 atom % on the assumption that the total amount of the number of atoms of the scandium and the number of atoms of the aluminum in the aluminum nitride is 100 atom %.

* * * * *